United States Patent
Berg, Jr. et al.

(10) Patent No.: US 6,637,845 B2
(45) Date of Patent: Oct. 28, 2003

(54) TELECOMMUNICATIONS CHASSIS AND CARD WITH FLAME SPREAD CONTAINMENT

(75) Inventors: Robin Berg, Jr., Shakopee, MN (US); Todd Husom, Crystal, MN (US); Derek Sayres, Lonsdale, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/795,656

(22) Filed: Feb. 28, 2001

(65) Prior Publication Data

US 2002/0118524 A1 Aug. 29, 2002

(51) Int. Cl.[7] ............................................. A47B 97/00
(52) U.S. Cl. ..................................... 312/223.2; 312/213
(58) Field of Search .......................... 312/223.1, 223.2, 312/265.5, 265.6, 210, 213, 332.1; 211/26, 41.17; 361/796, 797, 724, 725

(56) References Cited

U.S. PATENT DOCUMENTS

| | | | |
|---|---|---|---|
| 4,328,897 A | | 5/1982 | Weiss |
| 5,319,520 A | * | 6/1994 | Sugiyama et al. ..... 211/41.17 X |
| 5,339,362 A | | 8/1994 | Harris |
| 5,350,304 A | * | 9/1994 | Fula et al. ............... 312/213 X |
| 5,394,305 A | * | 2/1995 | Moral et al. .......... 211/41.17 X |
| 5,590,938 A | * | 1/1997 | De Andrea .......... 312/265.5 X |
| 5,816,673 A | * | 10/1998 | Sauer et al. ............. 312/223.2 |
| 5,892,662 A | | 4/1999 | Verma |
| 5,893,618 A | * | 4/1999 | LePage, Jr. et al. ..... 312/213 X |
| 5,966,648 A | | 10/1999 | Ortberg et al. |
| 5,991,163 A | * | 11/1999 | Marconi et al. ......... 361/724 X |
| 6,154,361 A | * | 11/2000 | Anderson et al. .... 312/223.1 X |
| 6,164,738 A | * | 12/2000 | Dane et al. ............. 312/213 X |
| 6,181,570 B1 | * | 1/2001 | Ellebrecht et al. .......... 361/797 |
| 6,246,580 B1 | * | 6/2001 | Weng ................... 312/223.2 X |
| 6,317,329 B1 | * | 11/2001 | Dowdy et al. ........ 312/332.1 X |
| 6,322,175 B1 | * | 11/2001 | Aggus et al. ........ 312/223.1 X |

FOREIGN PATENT DOCUMENTS

| | | | |
|---|---|---|---|
| DE | 1 271 793 | 7/1968 | |
| DE | 1 282 758 | 11/1968 | |
| DE | 2 164 371 | 6/1973 | |
| DE | 2710356 | * 9/1977 | ................. 312/213 |
| EP | 0 881 871 A2 | 12/1998 | |

OTHER PUBLICATIONS

DV6000 MMDS Optimized Intermediate Frequency (IF) Encoders and Decoders, ADC Telecommunications, Inc., Dec. 1998.

DV6000 DVFE Fast EtherRing Switch 10Base–T and 100Base–TXFX, ADC Telecommunications, Inc., Dec. 1998.

Homeworx Transport Platform Forward Path Headend Optical Transmitter, ADC Telecommunications, Inc., 1996.

Homeworx Transport Platform RL1/RL9 Forward Path Optical Receivers, ADC Telecommunications, Inc., 1996.

(List continued on next page.)

*Primary Examiner*—James O. Hansen
(74) *Attorney, Agent, or Firm*—Merchant & Gould

(57) ABSTRACT

A chassis and associated telecommunication circuit card are disclosed. The chassis has heat dissipation and flame containment features while accommodating a high density of the circuitry cards. Embodiments include an inner housing with a double-layer middle floor dividing the chassis into top and bottom chambers. Each layer has partially aligned slots, and an air gap is provided between the two layers. Embodiments also include a double-layer mesh cover with an air gap existing between the two mesh layers. Projections and grooves are provided on the inner surfaces of the inner housing to receive circuit cards having a guide on one edge and a fin on another. The guide includes an opening that at least partially aligns with slots on the adjacent surface of the inner housing. The circuit card includes a finger extending from a faceplate that facilitates insertion and removal of the circuit card relative to the chassis.

19 Claims, 45 Drawing Sheets

OTHER PUBLICATIONS

Homeworx Transport Platform Reverse Path QUAD Receiver and QUAD RF A/B Switch, ADC Telecommunications, Inc., 1996.
Homeworx Transport Platform Targeted Services Distribution Shelf, ADC Telecommunications, Inc., 1996.
Homeworx HWX Transmission System HWX 1550 nm Transmitter and Amplifier, ADC Telecommunications, Inc., 1996.
Homeworx HWX Transmission System HWX 750 MHz 1310 nm DFB Transmitter, ADC Telecommunications, Inc., 1996.
Homeworx HWX Transmission System HWX 1310/1550 nm Equipment Shelf, ADC Telecommunications, Inc., 1996.
Homeworx HWX Transmission System HWX Power Supply/Controller Module, ADC Telecommunications, Inc.
Homeworx HWX Transmission System HWX 860 MHz 1310 nm DFB Transmitter, ADC Telecommunications Inc.
Homeworx HWX Integrated Fan and Power Supply, ADC Telecommunications, Inc., Nov. 1997.
Smart–Nett Advanced Network Management, ADC Telecommunications, Inc., Nov. 1997.
OSWORX Commander, ADC Telecommunications, Inc., Dec. 1998.
DSX–1 Digital Signal Cross–Connect Modules, Panels and Accessories (Sixth Edition), , ADC Telecommunications, Inc., May 1998.
DSX–1 Digital Signal Cross–Connect Super High Density Bays High Density Bays (Sixth Edition), ADC Telecommunications, Inc., May 1998.
PxPlus DS1 Digital Signal Cross–Connect, ADC Telecommunications, Inc., Jan. 1997.
84 Termination Modular Bantam Jack Panel, ADC Telecommunications, Inc., Sep. 1998.
RZX–3 Reduced Size DSX–3, ADC Telecommunications, Inc., Jul. 1998.
RZX–3 Rear Cross–Connect Products, ADC Telecommunications, Inc., Jul. 1998.
Mini DSX–3 Products, ADC Telecommunications, Inc., Jun. 1997.
Mini DSX–3 Cross Aisle and Interbay Patch Panels, ADC Telecommunications, Inc., Feb. 1997.
Enteraprise 6000 High Performance Patch Cords, ADC Telecommunications, Inc., Oct. 1998.
Enteraprise 5000E Multimedia Outlets, ADC Telecommunications, Inc., Oct. 1998.
Enteraprise 5000E Patch Panels, ADC Telecommunications, Inc., Aug. 1998.
Enteraprise Structured Connectivity Systems FL1000 Product Family, ADC Telecommunications, Inc., Nov. 1998.
Chassis—Unloaded, Unloaded Chassis, ADC Telecommunications, Inc., Jul. 1998.
Soneplex DS3 Remote Control System, ADC Telecommunications, Inc., Jan. 1998.
Soneplex 220 HDSL Module, ADC Telecommunications, Inc., Nov. 1997.
Soneplex HDSL Central Office Module, ADC Telecommunications, Inc., Mar. 1998.
Soneplex HDSL OEM Subassembly, ADC Telecommunications, Inc., Jun. 1998.
Soneplex High–Powered HDSL Module (HEMI), ADC Telecommunications, Inc., Oct. 1998.
A New Twist On An Old Pair HDSL2: A Total Systems Approach, ADC Telecommunications, Inc., Nov. 1998.
Soneplex E1 Quad Loop Extender Four–Position Remote Chassis, ADC Telecommunications, Inc., Sep. 1998.
Soneplex E1 Quad Loop Extender Two–Position Remote Chassis, ADC Telecommunications, Inc., Sep. 1998.
Soneplex E1 Quad Loop Extender Module (EQLX), ADC Telecommunications, Inc., Sep. 1998.
Soneplex Quad Loop Extender Four Position Remote Chassis, ADC Telecommunications, Inc., Nov. 1997.
Soneplex Quad Loop Extender Two–Position Remote Chassis, ADC Telecommunications, Inc., Nov. 1997.
Soneplex Quad Loop Extender Module (QLX), ADC Telecommunications, Inc., Oct. 1997.
Soneplex ECX Channel Extender System, ADC Telecommunications, Inc., May 1998.
Soneplex Streaker Module, ADC Telecommunications, Inc., Nov. 1997.
Soneplex Test Access Unit, ADC Telecommunications, Inc., Nov. 1997.
Soneplex Extender Module, ADC Telecommunications, Inc., Nov. 1997.
Soneplex SNMP Management Access Point, ADC Telecommunications, Inc., Feb. 1998.
Soneplex DS1 Loop Extender Module, ADC Telecommunications, Inc., Feb. 1998.
Soneplex ADSL Loop Extender, ADC Telecommunications, Inc., Jun. 1998.
Soneplex Radiator Below Ground HDSL Repeater Housing, ADC Telecommunications, Inc., Feb. 1998.
Soneplex Radiator Above Ground HDSL Repeater Case, ADC Telecommunications, Inc., Nov. 1997.
Soneplex Radiator Test Access Card, ADC Telecommunications, Inc.
EZT1/DI Voice and Data Multiplexer, ADC Telecommunications, Inc., Jun. 1998.
EZT1 Voice Multiplexer, ADC Telecommunications, Inc., Mar. 1998.
EZT1/DI—HDSL Voice and Data Multiplexer, ADC Telecommunications, Inc., Jul. 1998.
EZT3 DS3 Access Multiplexer, ADC Telecommunications, Inc., Nov. 1997.
Opera Service Matrix Platform, ADC Telecommunications, Inc., Nov. 1998.
Opera Service Matrix Platform, ADC Telecommunications, Inc., Nov. 1998.
Cellworx STN Service Transport Node, ADC Telecommunications, Inc., Mar. 1998.
Cellworx STN Service Transport Node SDH Version, ADC Telecommunications, Inc., Apr. 1998.
Cellworx Subscriber Acess Terminal (SAT–100) ADSL Adapter, ADC Telecommunications, Inc.
Cellworx Subscriber Access Terminal (SAT–150) ADSL Remote Access Unit, ADC Telecommunications, Inc., Jul. 1997.
Fiber–Based ATM Virtual Path Rings—The Right Answer For Distance Learning Networks, ADC Telecommunications, Inc., Jul. 1998.
DS3 Fiber Loop Converter, ADC Telecommunications, Inc., Jan. 1997.
E1 Dual Fiber Loop Converter System, ADC Telecommunications, Inc., May 1997.
E1 Quad Fibre Loop Converter and Universal Mounting Chassis, ADC Telecommunications, Inc., Jan. 1998.
E1 Quad Fibre Loop Converter System B2 Version, ADC Telecommunications, Inc., May 1998.

Network Control Patchwork and PatchSwitch Products–Sixth Edition, ADC Telecommunications, Inc., Nov. 1995.

PatchMare Miniature Chassis, ADC Telecommunications, Inc., Feb. 1997.

FL1000 Customer Premises Fiber Distribution Products, ADC Telecommunications, Inc.

Fiber Cable Management Products, ADC Telecommunications, Inc., Jun. 1998.

FiberGuide Fiber Management Systems, ADC Telecommunications, Inc., Jun. 1998.

Fiber Entrance Cabinet, ADC Telecommunications, Inc., Jul. 1998.

Secure Fiber Entrance Terminal (SFET), ADC Telecommunications, Inc., May 1998.

Optical Test Access Unit (OTAU), ADC Telecommunications, Inc., Mar. 1998.

Value–Added Module System, ADC Telecommunications, Inc., Jun. 1998.

Fiber Optic Couplers, Splitters and Wavelength Division Multiplexers, ADC Telecommunications, Inc., Jul. 1997.

FiberBase Fiber Network Managment Software, ADC Telecommunications, Inc., Apr. 1998.

Homeworx Access Platform Telephony System, ADC Telecommunications, Inc., Feb. 1996.

HWX Receiver Modules Forward Path and Dual Return Path Receiver, ADC Telecommunications, Inc., Dec. 1998.

DV6000 Universal Digital Transmission System Dual DS3/DS1 Encoders and Decooders, ADC Telecommunications, Inc., 1996.

DV6000 Universal Digital Transmission System Dual E3/E1 Encoders and Decoders, ADC Telecommunications, Inc., 1996.

DV6000 Intermediate Frequency (IF) Video Encoders and Decoders, ADC Telecommunications, Inc., Dec. 1998.

DV6000 Universal Digital Transmission System DV6000 Repeater Shelf and Controller, ADC Telecommunications, Inc., 1996.

Dv6010 Bidirectional Digital Transmission System, ADC Telecommunications, Inc., Jul. 1997.

DV6000 Universal Digital Transmission System DV–6120–DS Dual Optical Switch, ADC Telecommunications, Inc., 1996.

DV6300 Single Channel Digital Transport System, ADC Telecommunications, Inc., Jun. 1997.

DV6000 Universal Digital Transmission System Serial Digital Video (D1) Interface Cards, ADC Telecommunications, Inc., 1996.

DV6000 Dense Wavelength Division Multiplexing (DWDM) with DV6000, ADC Telecommunications, Inc., Jun. 1997.

DV6000 PAL IF Encoders and Decoders, ADC Telecommunications, Inc., Dec. 1998.

ADC Transport Systems Group Complete Products Catalog, ADC Telecommunications, Inc., Sep. 1998.

Soneplex DS3 Remote Control System, ADC Telecommunications, Inc., Jan. 1998.

Soneplex LAN Extension System, ADC Telecommunications, Inc., Feb. 1998.

Soneplex E1 Loop Extender Platform, ADC Telecommunications, Inc., Jan. 1998.

Soneplex Access Multiplexer System, SDH Version,, ADC Telecommunications, Inc., Mar. 1998.

Soneplex Access Multiplexer System, ADC Telecommunications, Inc., Feb. 1998.

Soneplex Loop Extender System, ADC Telecommunications, Inc., Dec. 1998.

Soneplex HDSL Test Kits, ADC Telecommunications, Inc., Aug. 1998.

Soneplex HDSL 239 Repeater, ADC Telecommunications, Inc., Mar. 1998.

Soneplex HDSL Remote Enclosures, ADC Telecommunications, Inc., May 1998.

Soneplex 220 HDSL Single–Position Chassis, ADC Telecommunications, Inc., Nov. 1997.

Soneplex HDSL 819 Repeater, ADC Telecommunications, Inc., Nov. 1997.

Soneplex Radiator HDSL Repeater Housings—A Recipe For Success, ADC Telecommunications, Inc., May 1998.

Soneplex Nx 64 KBPS E1 HDSL System, ADC Telecommunications, Inc., Jan. 1998.

Soneplex HDSL Single Shot Repeater, ADC Telecommunications, Inc., Nov. 1997.

Soneplex 220 HDSL Two–Position Chassis, ADC Telecommunications, Inc., Jan. 1998.

Soneplex 3192 HDSL Module, ADC Telecommunications, Inc., Nov. 1997.

Soneplex T1 Repeater Module, ADC Telecommunications, Inc., Nov. 1997.

Soneplex E1 Loop Extender Platform, ADC Telecommunications, Inc., Jan. 1998.

Soneplex Loop Extender System, ADC Telecommunications, Inc., Dec. 1998.

Soneplex T1 Repeater Module, ADC Telecommunications, Inc., Nov. 1997.

U.S. patent application No. 09/861,187 entitled "Telecommunications Chassis and Card" (02316–1494US01).

* cited by examiner

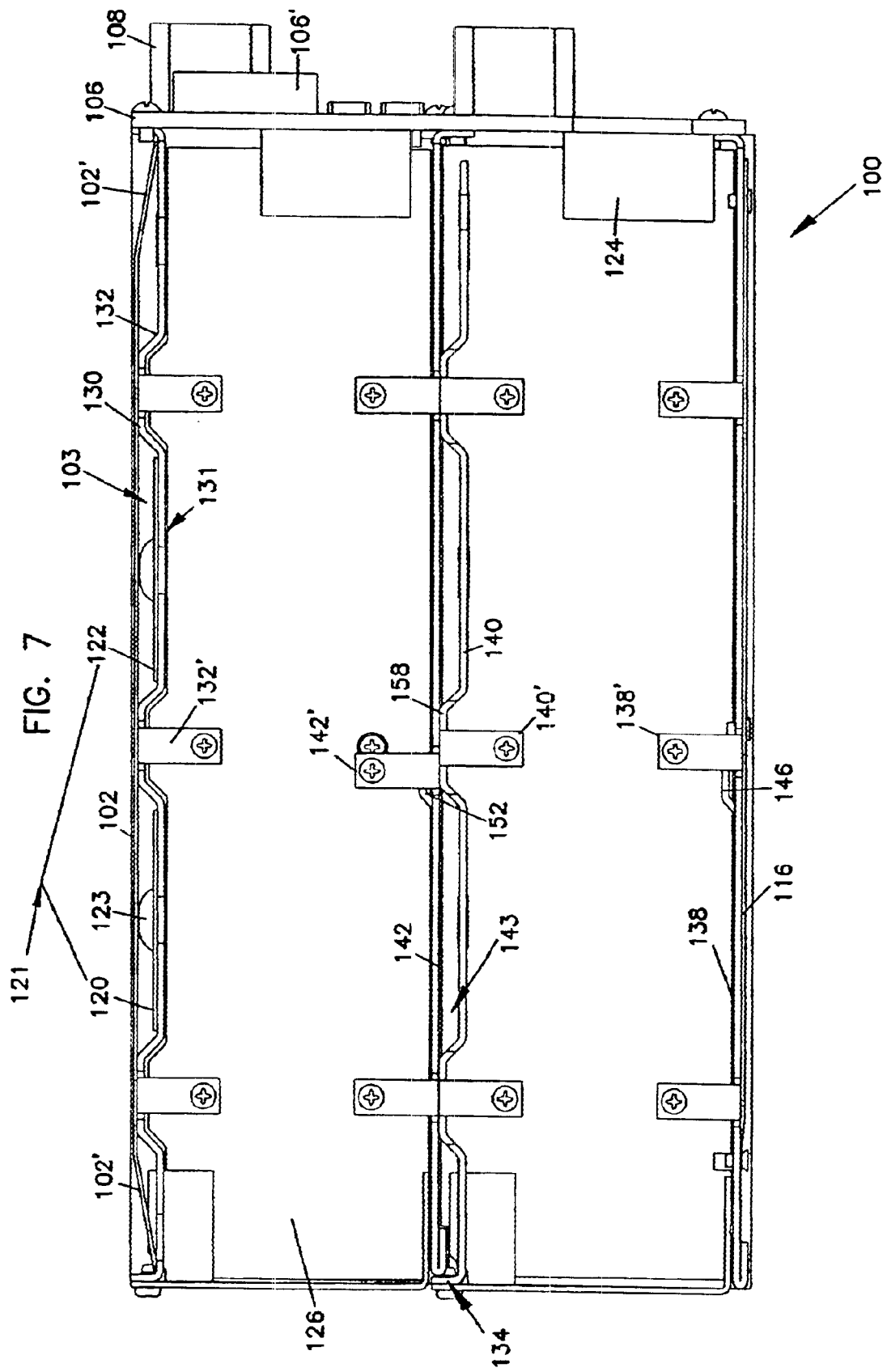

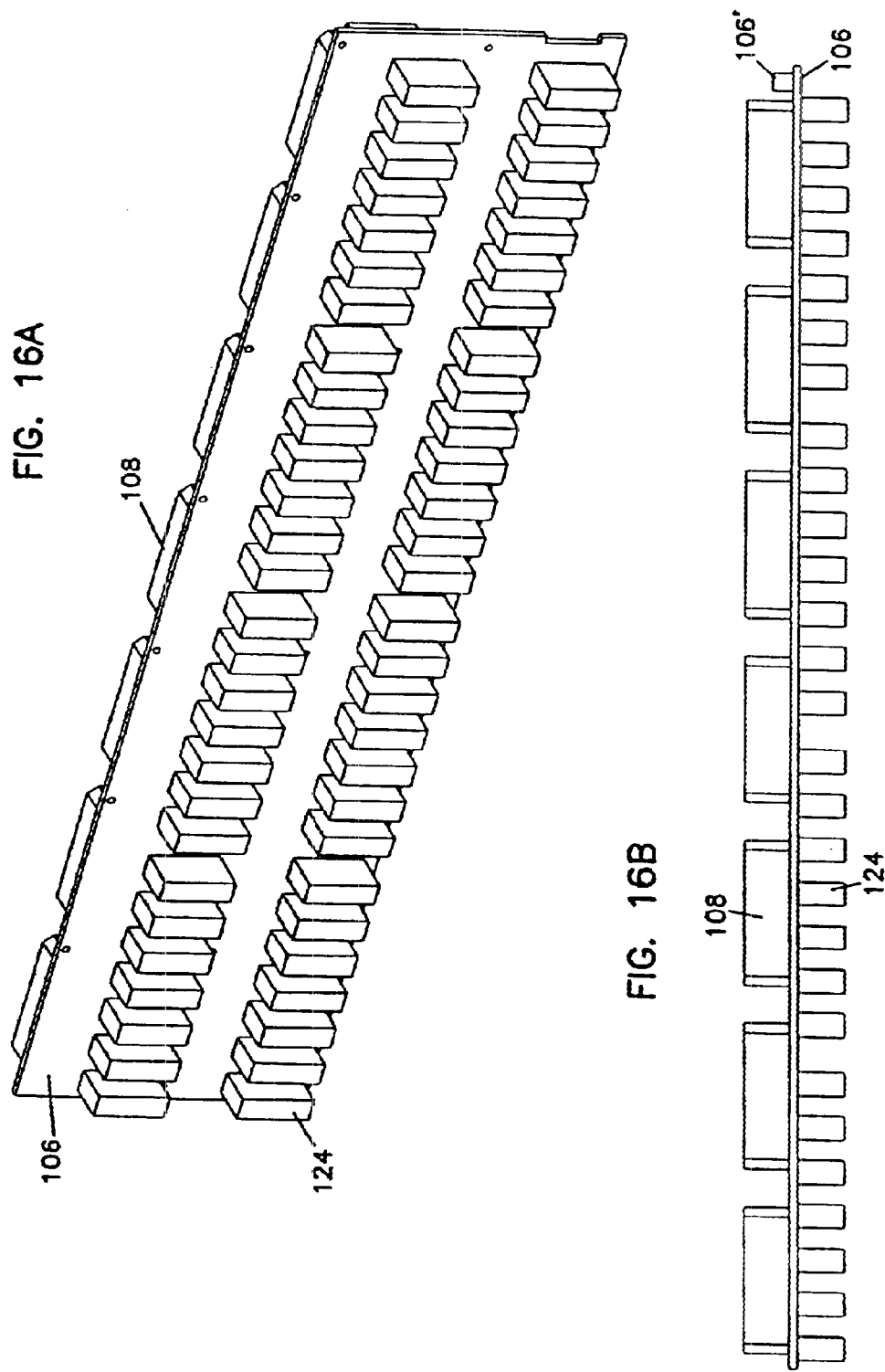

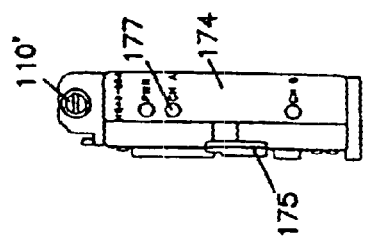
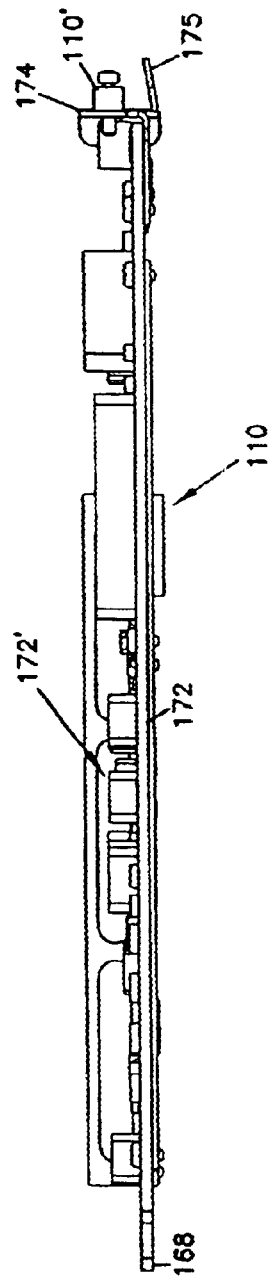
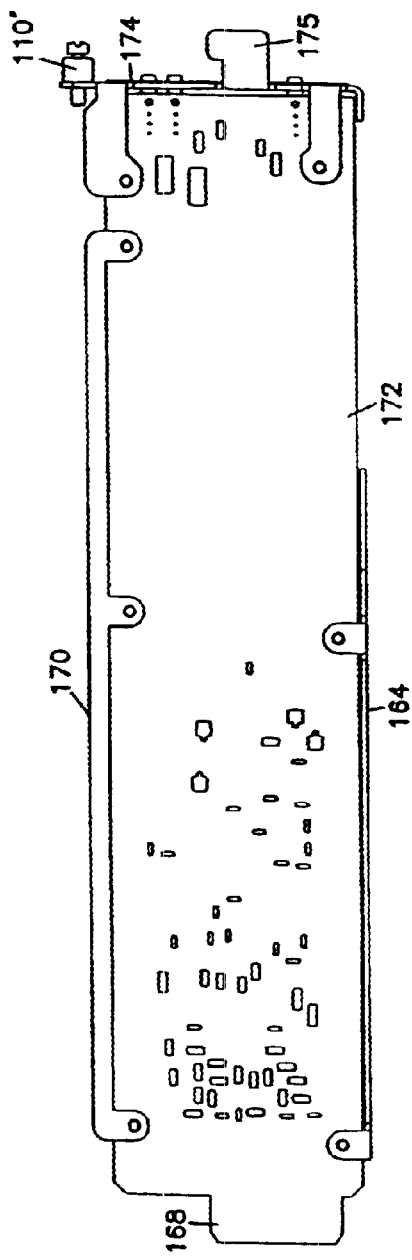

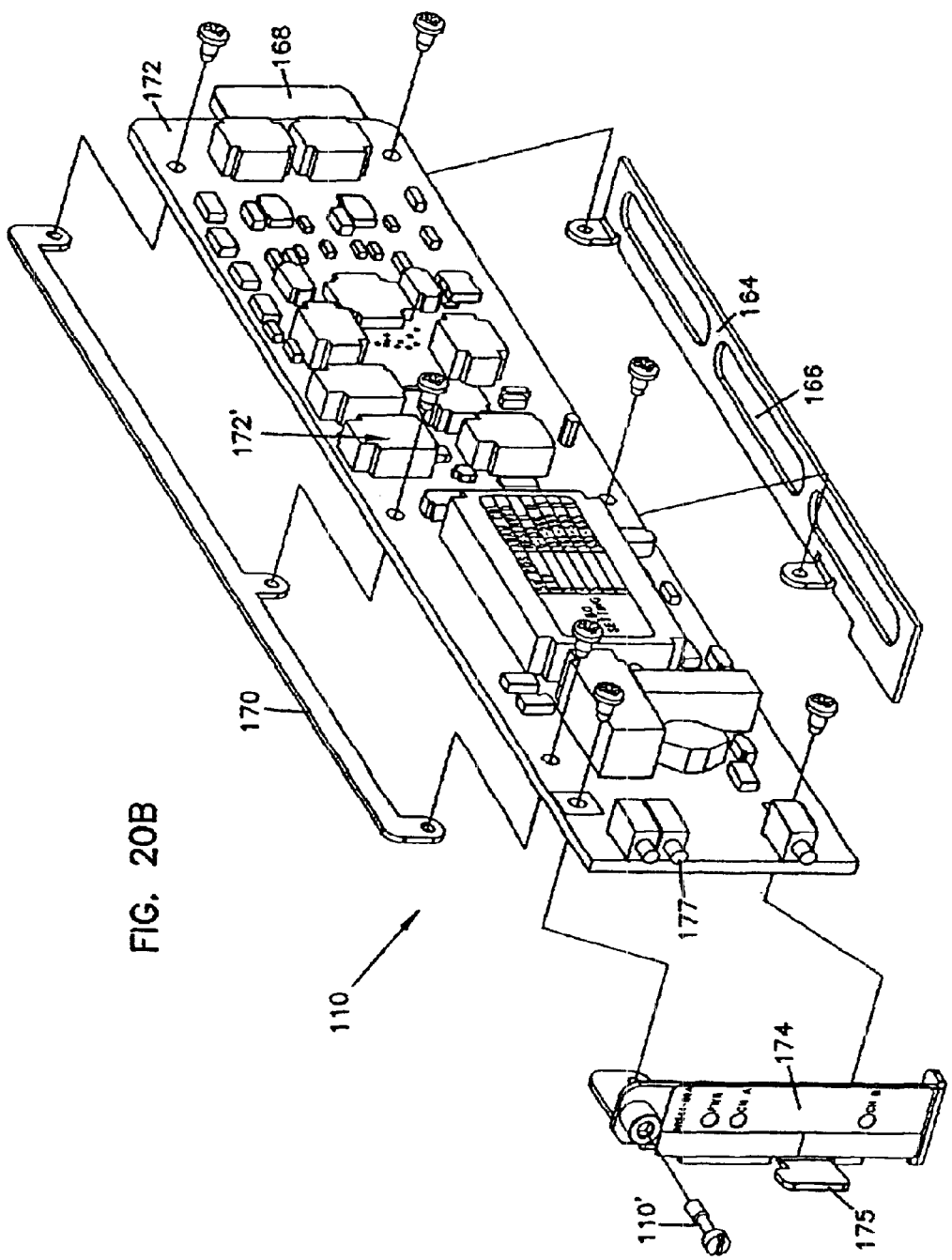

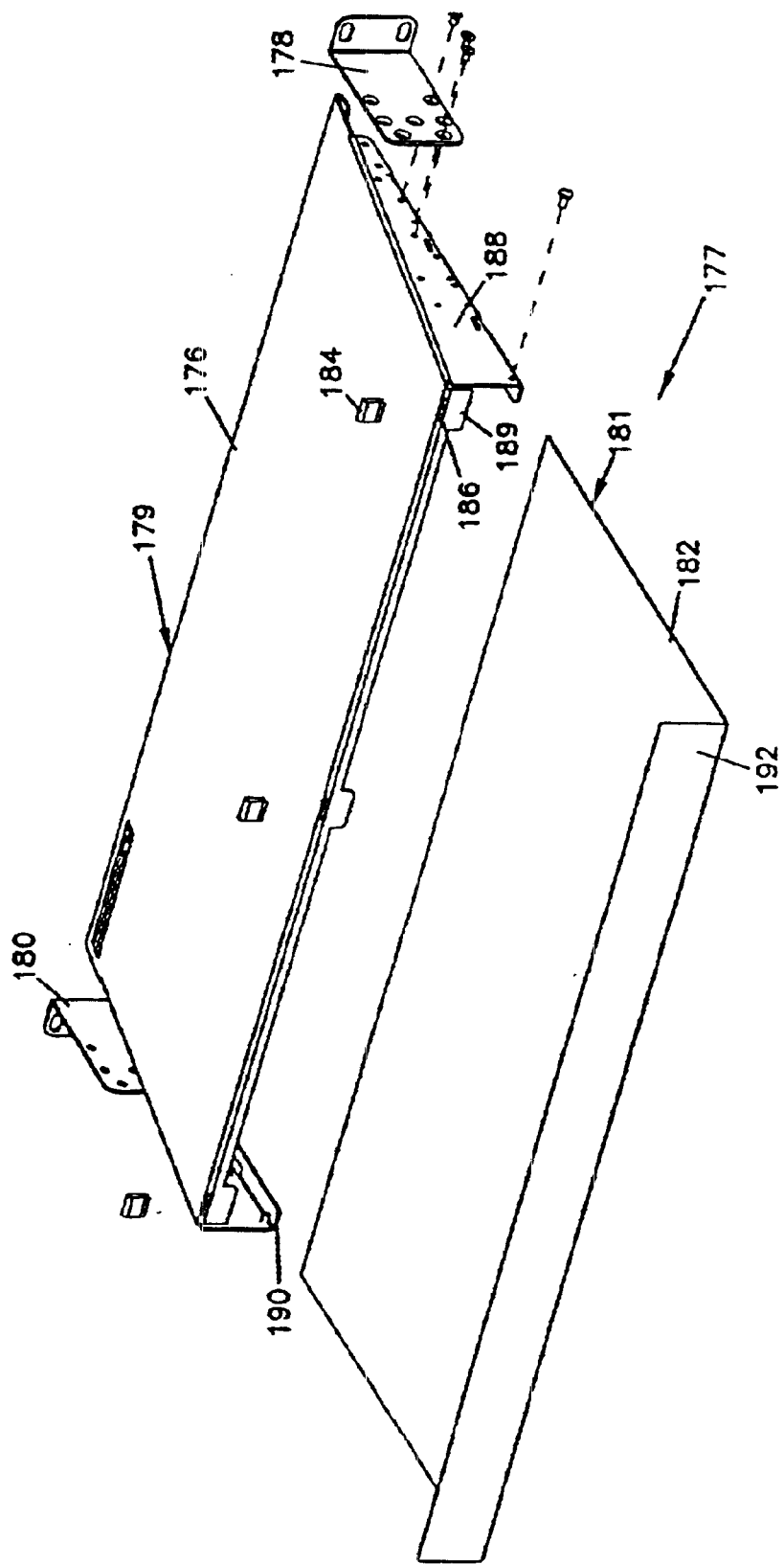

TELECOMMUNICATIONS CHASSIS AND CARD WITH FLAME SPREAD CONTAINMENT

TECHNICAL FIELD

This invention relates to chassis for holding telecommunications cards such as repeater circuits. More specifically, the present invention relates to chassis and cards with flame spread containment features.

BACKGROUND

A chassis for holding telecommunication circuit cards must support a sufficient density of cards to be effective, yet it must also effectively dissipate heat developed during operation while containing the spread of flames should a fire be imposed within the chassis. The cards installed in the chassis perform electrical operations, such as signal transception and amplification that generate a significant amount of heat. Typically, a chassis is installed in a rack that contains several other chassis stacked above and below. The heat and flames that may develop within a chassis in the rack have the potential to harm circuit cards housed in the chassis above and below the chassis where the heat and/or flames emanate from.

The chassis must also provide external protection for the circuit cards it houses. Thus, the chassis cannot freely expose the circuit cards to areas outside the chassis when attempting to dissipate heat and flames. Additionally, the chassis must provide a structural interconnection that maintains electrical continuity between the circuit cards and external transmission mediums such as copper wires or fiber optic cables while facilitating insertion and removal of the cards. A sufficient structure must be used to facilitate this circuit card modularity, which further limits the chassis' ability to provide outlets for heat and flames.

Thus several factors must be accounted for in the chassis and card design. Chassis designs with large interior spaces for directing heat and flames away from circuit cards may be undesirable because the chassis may become too large to accommodate a high density of circuits. Chassis designs with open exteriors for directing heat and flames away from the circuit cards may be undesirable because the circuit cards may not be sufficiently protected from externalities such as falling objects or heat and flames spreading from a chassis positioned above or below in the rack.

Thus, there is a need for a chassis and card design whereby the chassis may contain a high density of readily removable circuit cards while providing effective heat dissipation and flame containment.

SUMMARY

The present invention provides a chassis and card design that may accommodate a high density of readily removable circuits while providing heat dissipation and flame containment features. Ventilation and containment structure are employed to direct heat away from internal circuitry while preventing flames from spreading within the chassis. Additionally, chassis designs of the present invention may provide exterior features that establish protection from externalities and prevent the harmful spread of heat and flames to chassis or other equipment stacked above or below.

The present invention may be viewed as a chassis for housing telecommunications cards. The chassis includes an inner housing with vertical sidewalls, a top surface, and a bottom surface, wherein the top surface and the bottom surface have a plurality of openings. A middle floor is disposed within the inner housing dividing the inner housing into a top chamber and a bottom chamber and includes a bottom plate and a top plate. The top plate overlays the bottom plate with a separation between at least portions of the top plate and the bottom plate, and the bottom plate has openings that at least partially align with openings provided in the top plate. A first cover overlays the top surface, and a bottom cover underlays the bottom surface.

The present invention may also be viewed as another chassis for housing telecommunications cards. The chassis includes an inner housing with vertical sidewalls, a top surface, a bottom surface, and a plurality of spaced inner side walls forming a plurality of compartments within the inner housing, wherein the top surface and the bottom surface have a plurality of spaced slots. A middle floor is disposed within the inner housing dividing each of the plurality of chambers into a top chamber and a bottom chamber, and it includes a bottom plate and a top plate with the top plate overlaying the bottom plate with a separation between at least portions of the top plate and the bottom plate. The bottom plate has slots that partially align with slots provided in the top plate. A first mesh cover overlays at least a portion of the top surface of the inner housing, and a second mesh cover overlays the first mesh cover and the top surface with a separation existing between the second mesh cover and the first mesh cover. A bottom mesh cover underlays the bottom surface of the inner housing.

The present invention may be viewed as another chassis for housing telecommunications cards. The chassis includes an inner housing with vertical sidewalls, a top surface, and a bottom surface, with the top surface and the bottom surface having a plurality of openings. A first mesh cover overlays at least a portion of the top surface of the inner housing, and a second mesh cover overlays the first mesh cover and the top surface with a separation existing between the second mesh cover and the first mesh cover.

The present invention may also be viewed as another chassis for housing telecommunications cards. The chassis includes an inner housing with vertical sidewalls, a first horizontal surface, and a second horizontal surface separated from the first horizontal surface by the vertical sidewalls, with the first horizontal surface and the second horizontal surface having a plurality of openings. A third horizontal surface is disposed within the inner housing between the first and second horizontal surfaces that divides the inner housing into a top chamber and a bottom chamber. The third horizontal surface includes a first horizontal plate and a second horizontal plate, wherein the first horizontal plate overlays the second horizontal plate with a separation between at least portions of the first horizontal plate and the second horizontal plate, and wherein the first horizontal surface and first horizontal plate define first and second horizontal surfaces of the top chamber and one of the horizontal surfaces of the top chamber has grooves and the other horizontal surface of the top chamber has projections for receiving a fin and guide of a telecommunications card. The second horizontal surface and second horizontal plate define first and second horizontal surfaces of the bottom chamber and one of the horizontal surfaces of the bottom chamber has grooves and the other horizontal surface of the bottom chamber has projections for receiving a fin and guide of a telecommunications card. A first cover is disposed over at least a portion of an outer portion of the first horizontal surface, and a second cover is disposed over at least a portion of an outer portion of the second horizontal surface.

The present invention may be viewed as a circuit card for installation in a chassis. The card includes a printed circuit board populated with electrical circuitry having a first electrical connector for connection to a second electrical connector in the chassis. The first electrical connector is positioned on a first edge of the printed circuit board, and the printed circuit board establishes a first spatial plane. A faceplate is positioned at a second edge of the printed circuit board opposite to the first edge. A guide is mounted to the printed circuit board along a third edge that is substantially perpendicular to the first and second edges, and the guide establishes a second spatial plane perpendicular to the first spatial plane. The guide has at least one opening.

The present invention may also be viewed as another circuit card for installation in a chassis. The circuit card includes a printed circuit board populated with electrical circuitry having a first electrical connector for connection to a second electrical connector in the chassis. The first electrical connector is positioned on a first edge of the printed circuit board, and the printed circuit board establishes a first spatial plane. A faceplate for abutting a chassis is also included and is positioned at a second edge of the printed circuit board opposite to the first edge. The faceplate has a finger extending from the faceplate and away from the printed circuit board. A guide is mounted to the printed circuit board along a third edge.

DESCRIPTION OF THE DRAWINGS

FIG. 7 is a side view of the empty chassis with the outer sidewall removed.

FIG. 16A is a top front perspective view of the backplane of the chassis.

FIG. 16B is a top view of the backplane of the chassis.

FIG. 19A is a top view of a repeater circuit card.

FIG. 19B is a left side view of the repeater circuit card.

FIG. 19C is a front view of the repeater circuit card.

FIG. 20B is an exploded top right perspective view of the repeater circuit card.

FIG. 21 is an exploded top rear perspective view of a heat baffle.

DETAILED DESCRIPTION

Figure 1A:
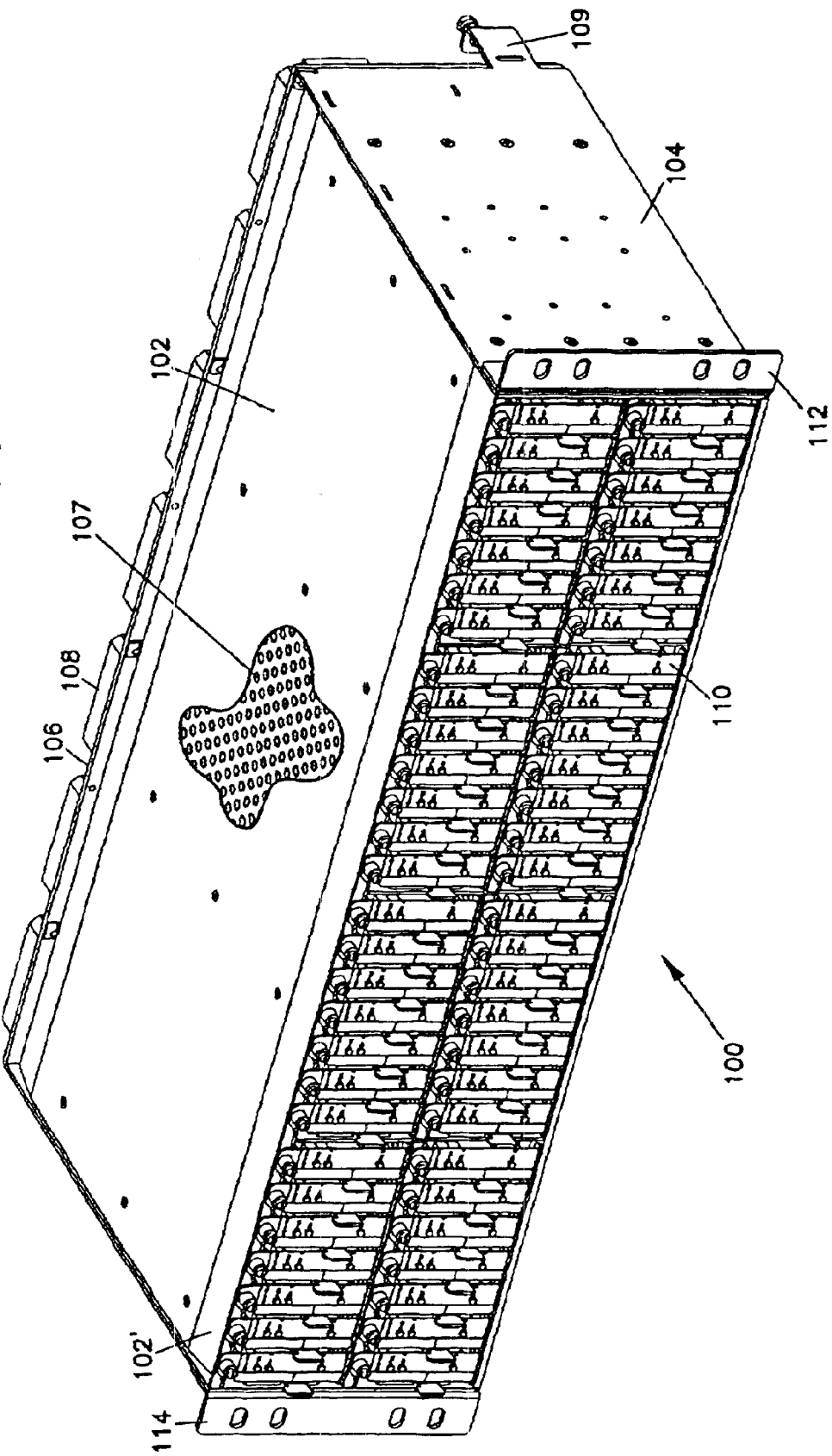
FIG. 1A is a top front perspective view of a chassis loaded with repeater cards.

Various embodiments of the present invention will be described in detail with reference to the drawings, wherein like reference numerals represent like parts and assemblies through the several views. Reference to various embodiments does not limit the scope of the invention, which is limited only by the scope of the claims attached hereto.

Figure 1B:
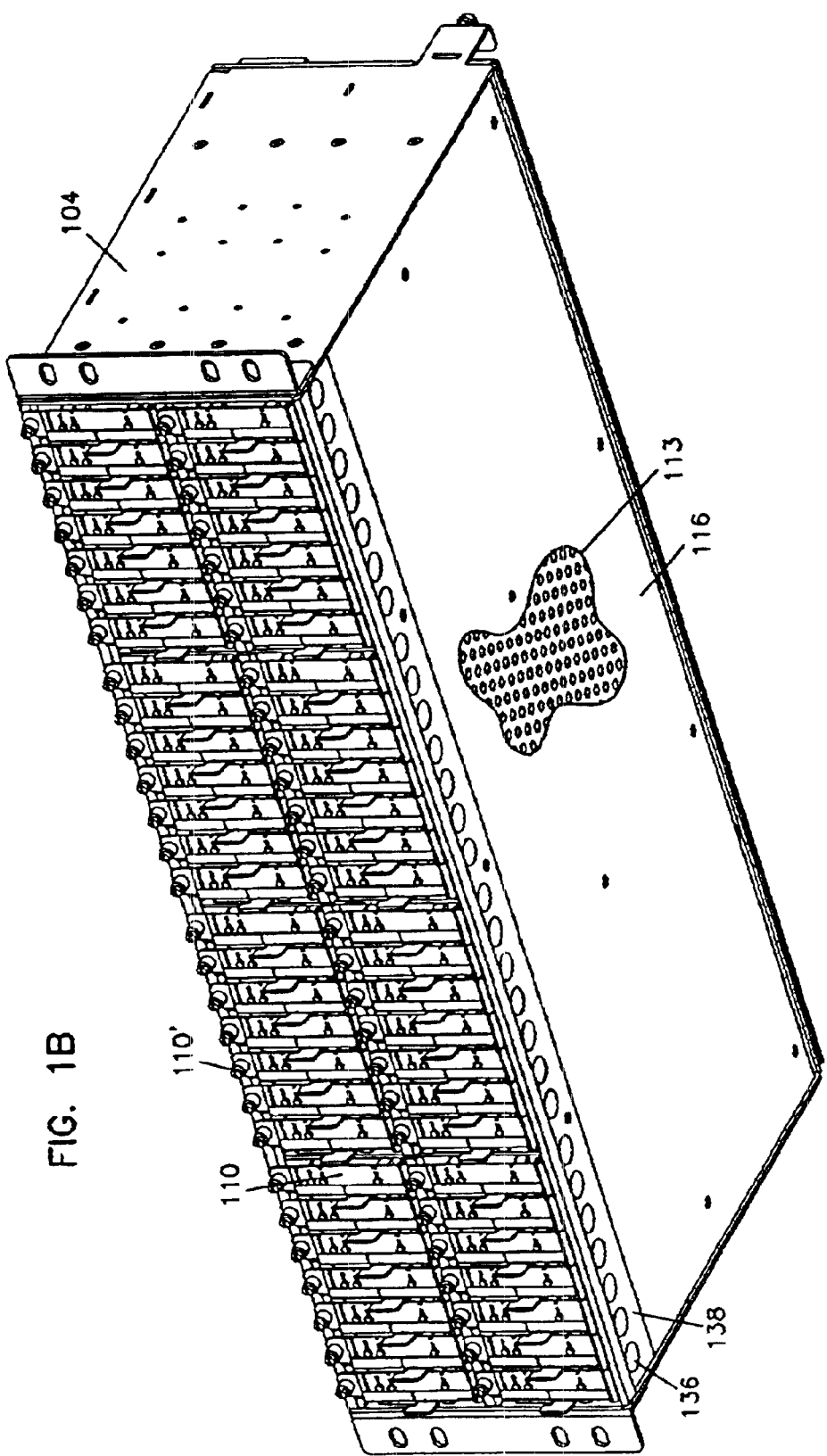
FIG. 1B is a bottom front perspective view of the chassis loaded with repeater cards.

FIGS. 1A and 1B show a loaded chassis 100 in accordance with one embodiment of the present invention. The chassis includes vertical sidewalls including right sidewall 104. A top mesh cover 102 is included, and this cover as well as other mesh covers discussed below typically are perforated rolled steel wherein the perforations provide air passages. Although the mesh attribute 107 of top mesh cover 102 is depicted only in FIG. 1A, the top mesh cover 102 in all subsequent drawings may be regarded as possessing mesh attribute 107. An exemplary mesh cover is made of aluminum and has 63% of its surface occupied by relatively small and densely positioned air passages, but other materials and air passage percentages for the mesh covers are also applicable. Cover 102 may have angular portions 102'. As with all surfaces of the chassis 100, the rolled steel may be used and may have a clear chromate plating to reduce electromagnetic interference. The chassis 100 also has a bottom mesh cover 116 that covers the majority of the bottom of the chassis 100 except for a strip of a bottom surface 138 of an inner housing discussed below that has ventilation holes 136. Although the mesh attribute 108 of bottom mesh cover 116 is depicted only in FIG. 1B, the bottom mesh cover 116 in all subsequent drawings may be regarded as possessing mesh attribute 108. as other mesh covers discussed below typically are perforated rolled steel wherein the perforations provide air passages. An exemplary mesh cover is made of aluminum and has 63% of its surface occupied by relatively small and densely positioned air passages, but other materials and air passage percentages for the mesh covers are also applicable. Cover 102 may have angular portions 102'. As with all surfaces of the chassis 100, the rolled steel may be used and may have a clear chromate plating to reduce electromagnetic interference. The chassis 100 also has a bottom mesh cover 116 that covers the majority of the bottom of the chassis 100 except for a strip of a bottom surface 138 of an inner housing discussed below that has ventilation holes 136.

A backplane 106 having external connectors 108 is included for establishing electrical communication between the circuit cards 110 housed by the chassis 100 and external cabling passing through the chassis rack. The external connectors 108 may be a terminal block, but other connector types are suitable as well. The cards typically have a mounting screw 110' that secures the card to the chassis 100. The chassis 100 includes mounting flanges 112 and 114 for installation of the chassis 100 in a rack. A ground connector 109 is included for providing chassis ground.

Figure 2:
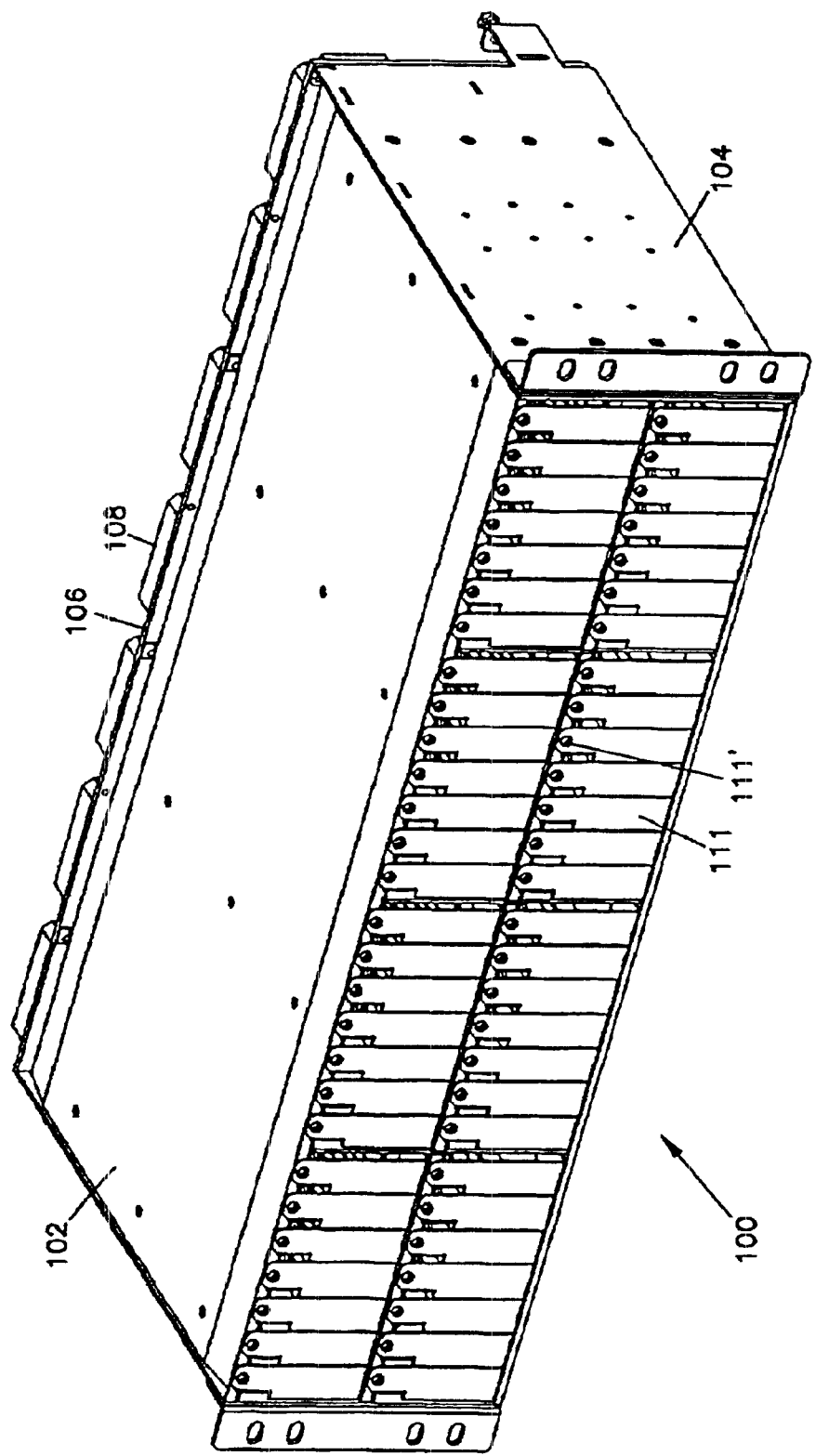
FIG. 2 is a top front perspective view of an empty chassis with card slot covers in place.
Figure 3A:
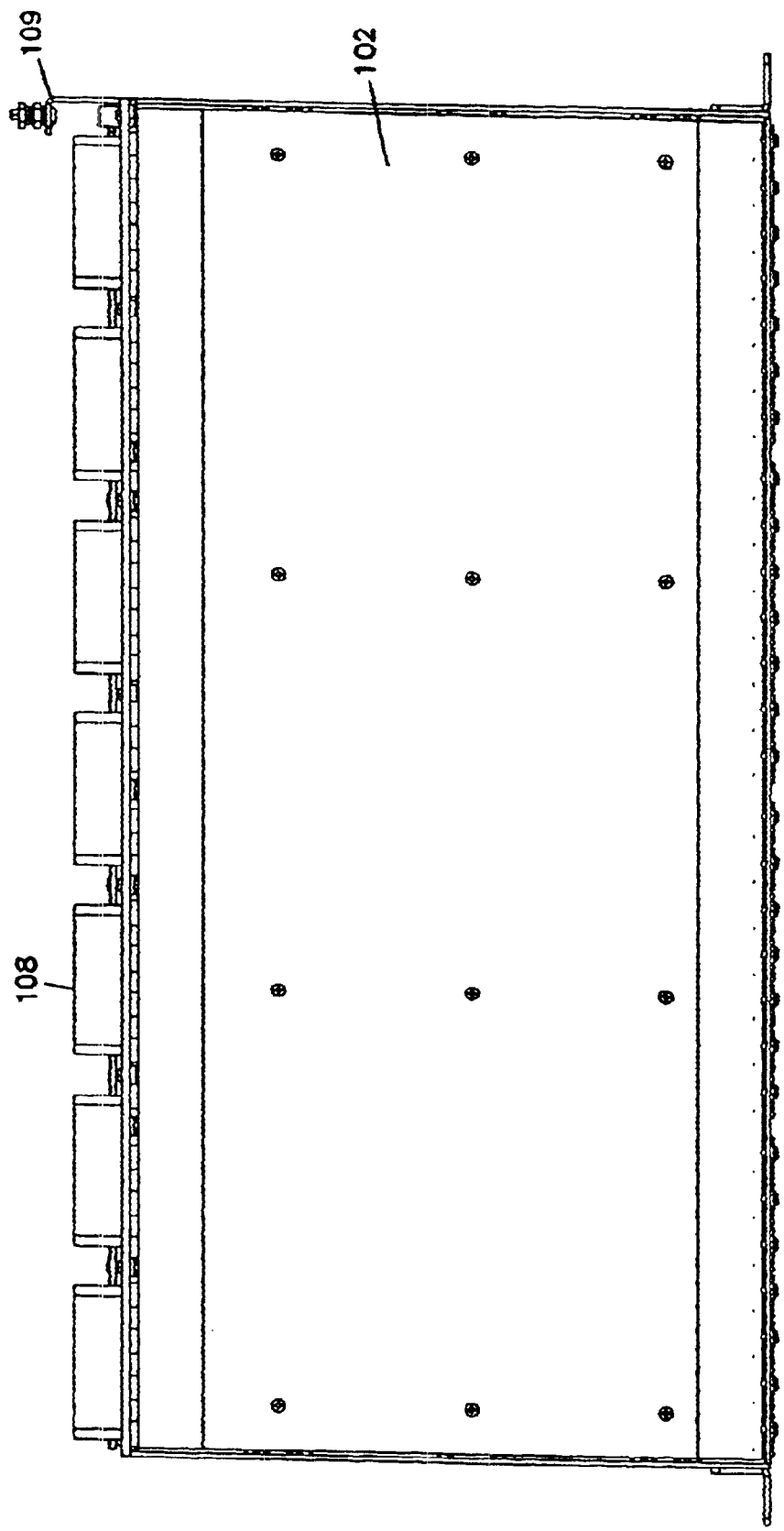
FIG. 3A is a top view of the empty chassis.
Figure 3B:
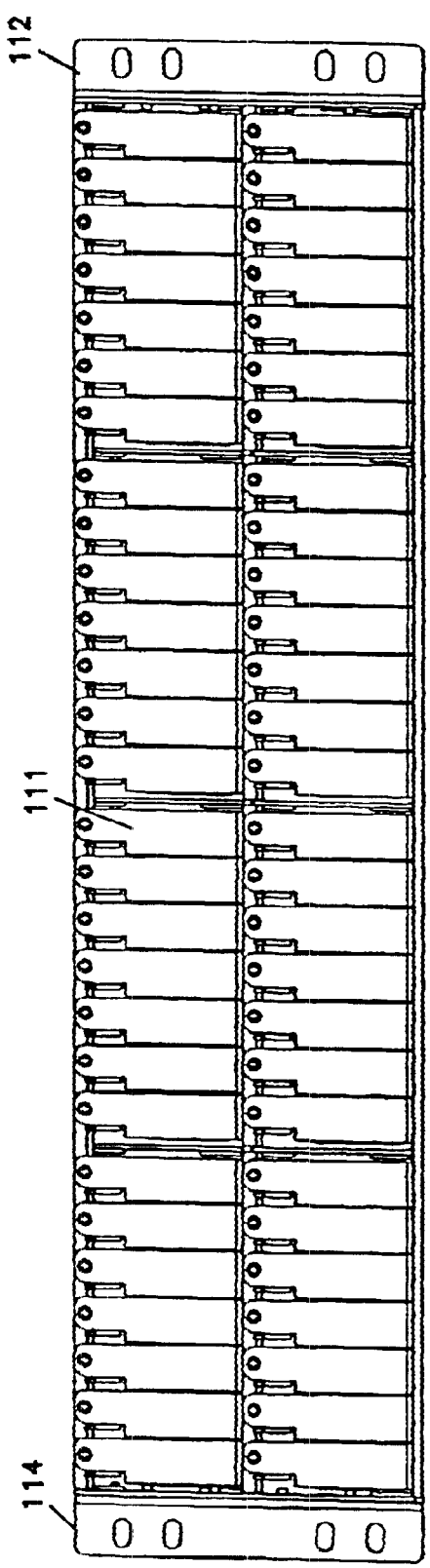
FIG. 3B is a front view of the empty chassis.
Figure 3C:
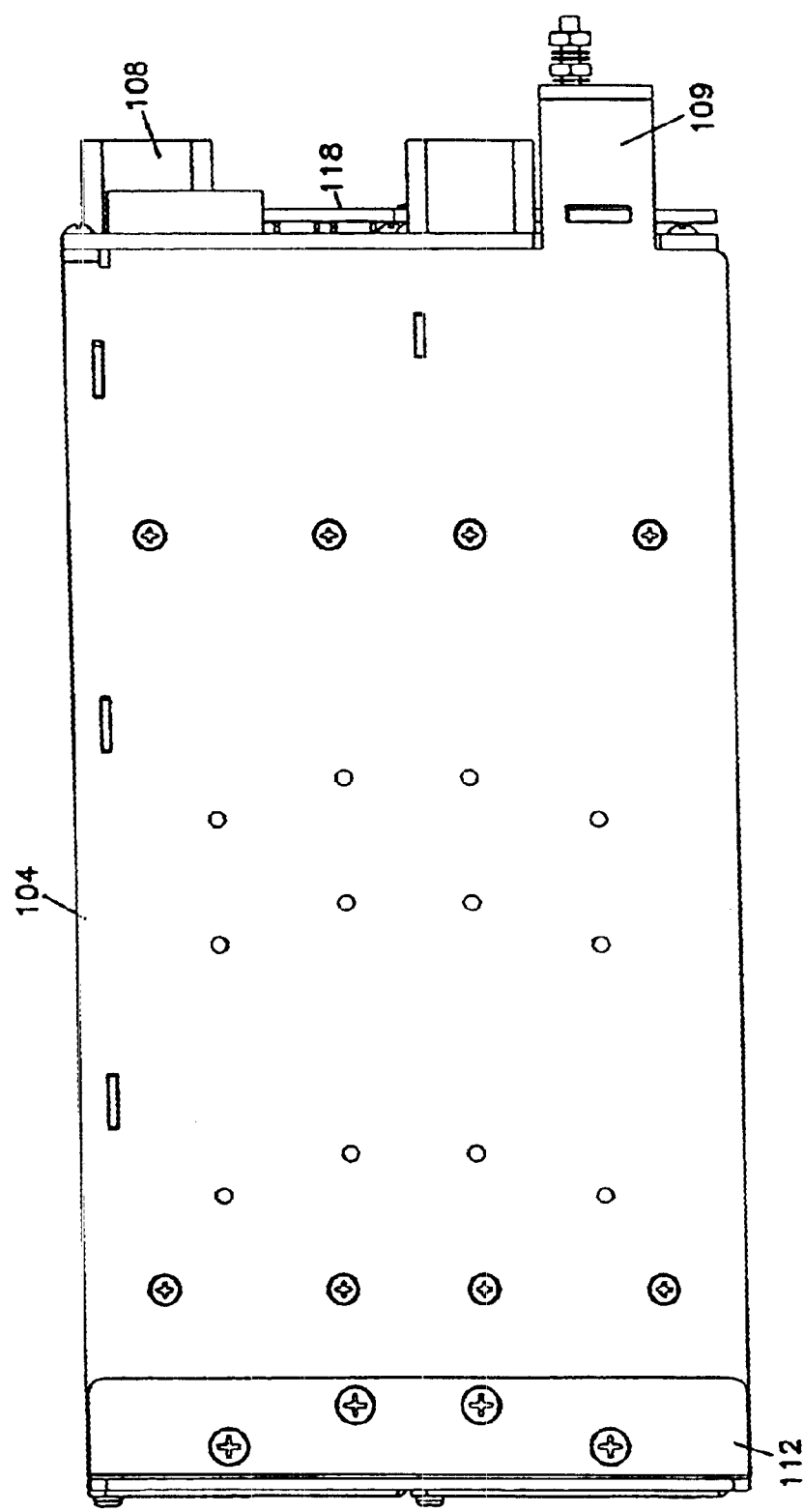
FIG. 3C is a right side view of the empty chassis.
Figure 5A:
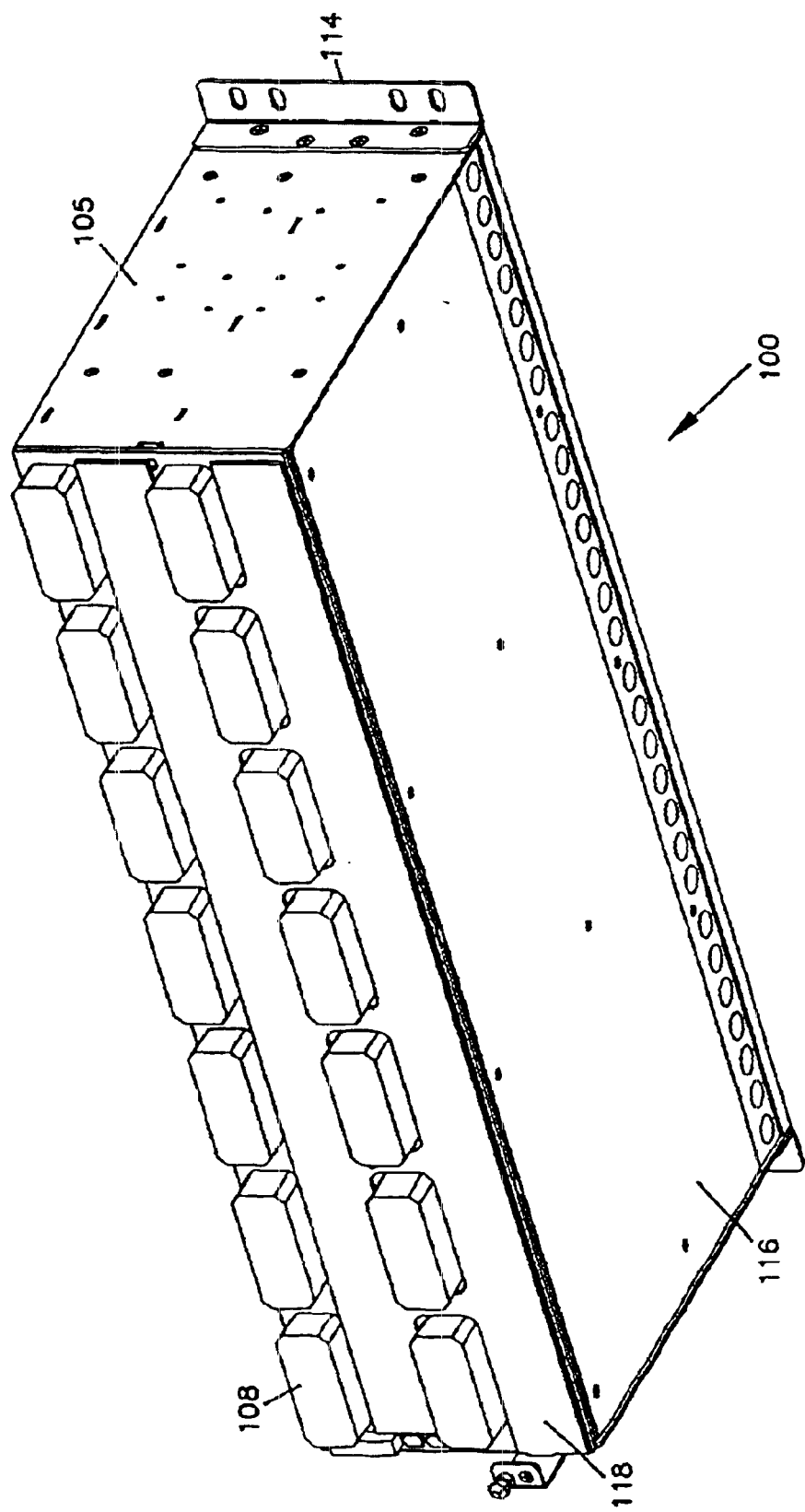
FIG. 5A is a bottom rear perspective view of the loaded chassis.
Figure 5B:
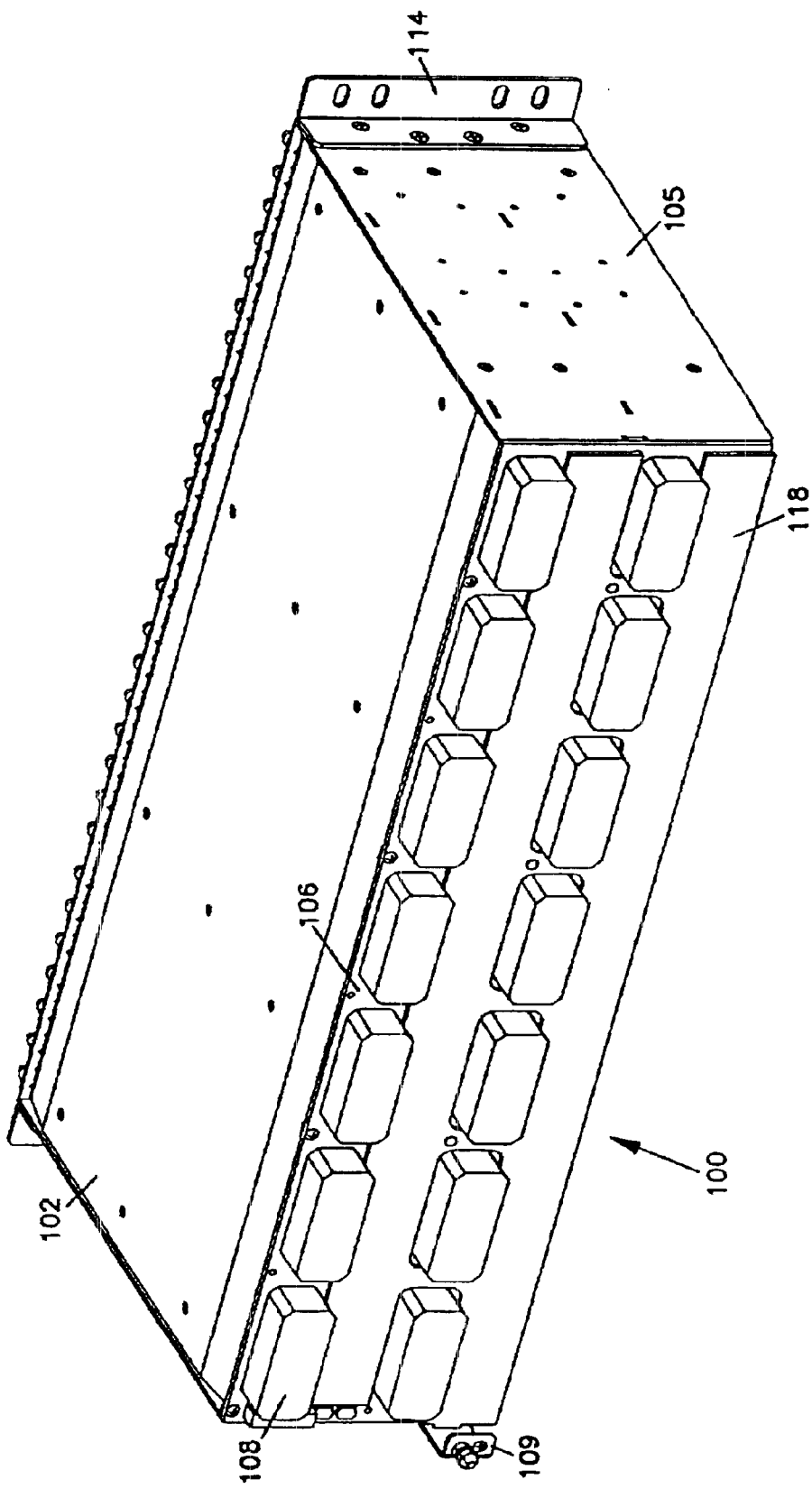
FIG. 5B is a top rear perspective view of the loaded chassis.
Figure 6A:
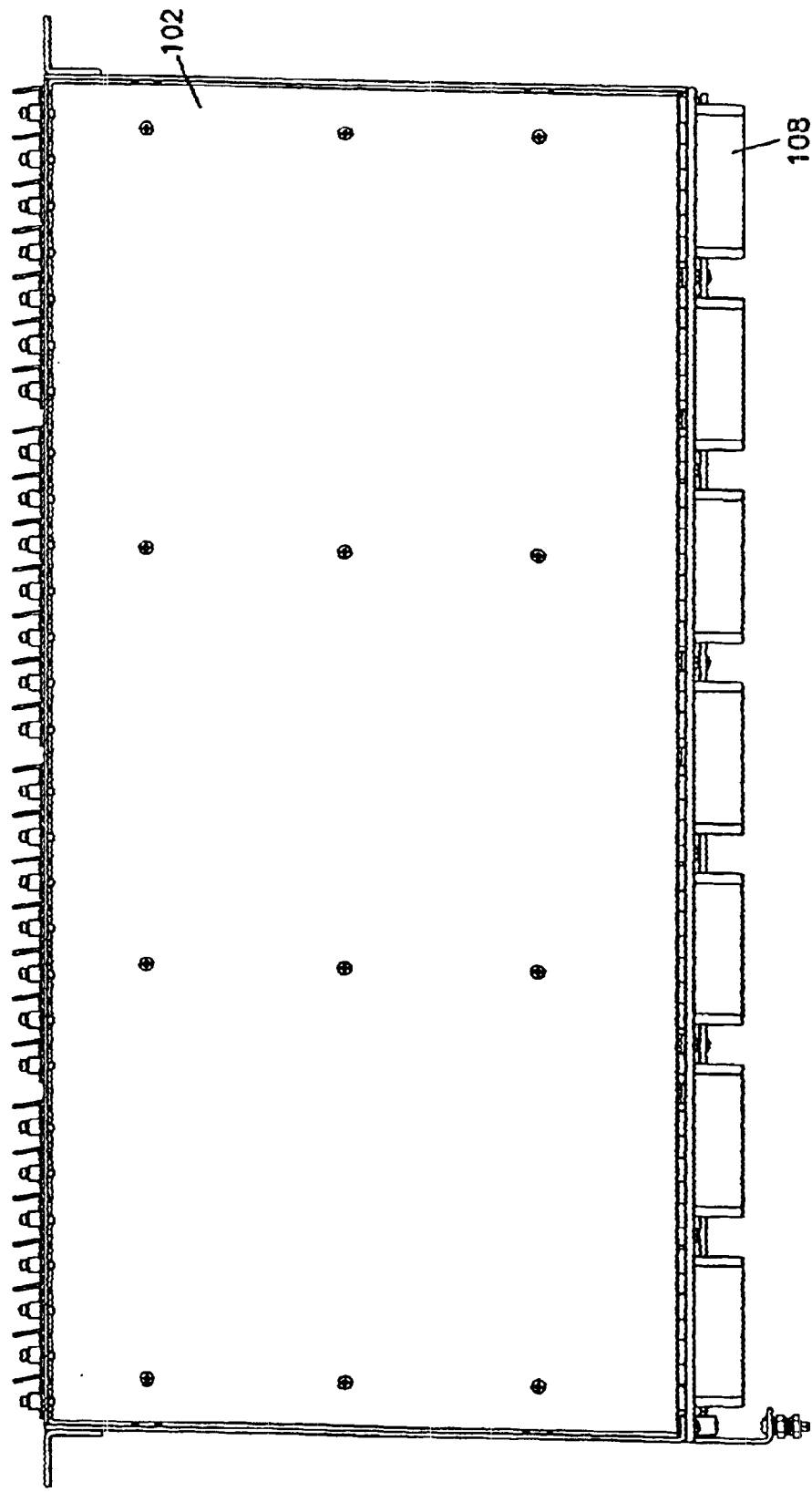
FIG. 6A is another top view of the loaded chassis.
Figure 6B:
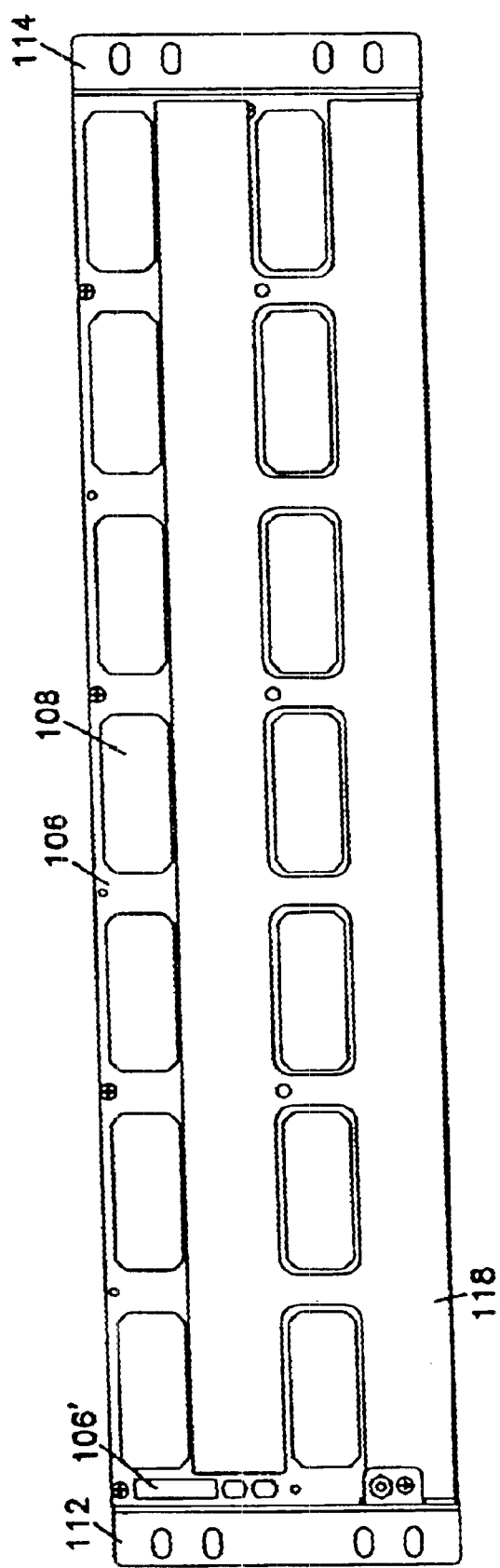
FIG. 6B is a rear view of the loaded chassis.
Figure 6C:
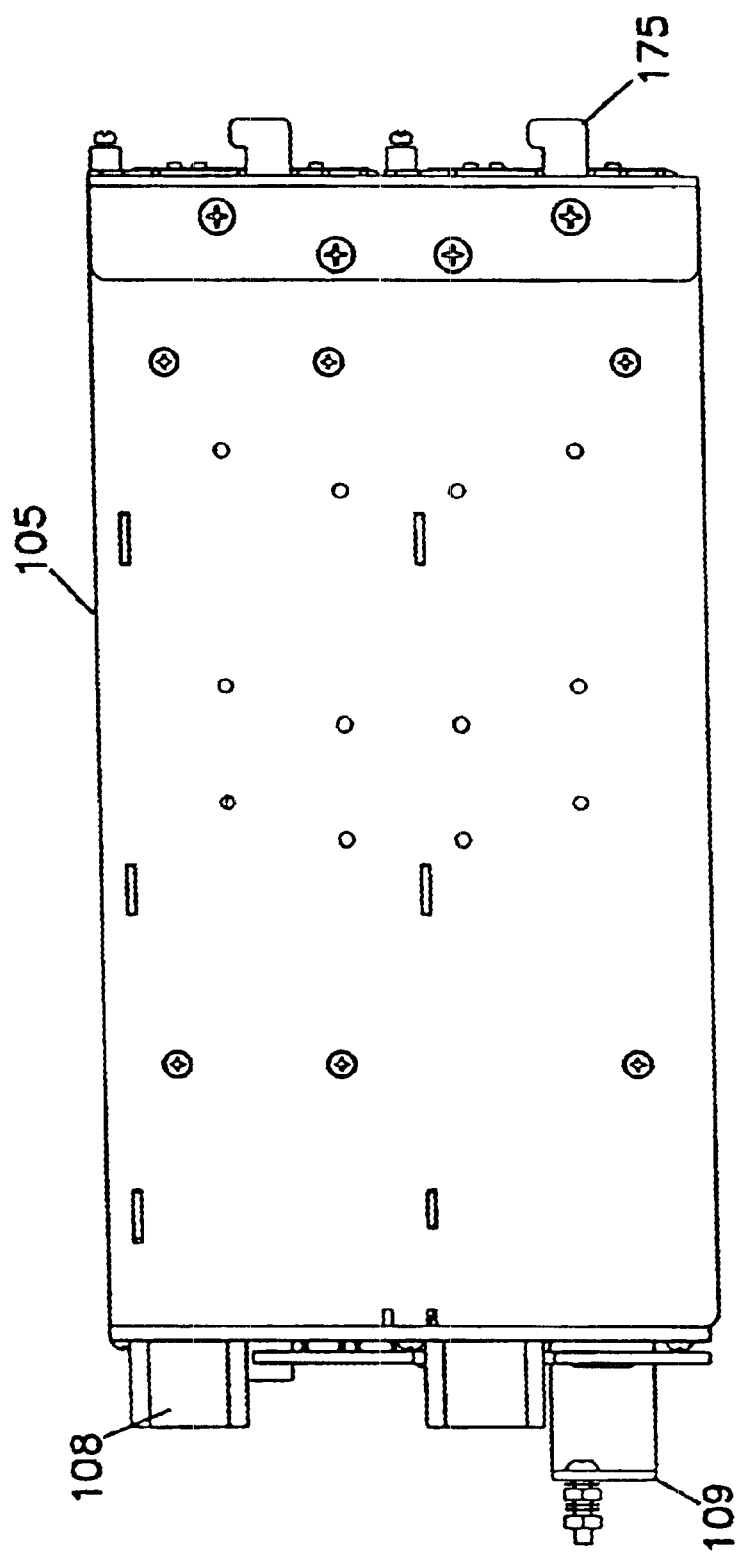
FIG. 6C is a left side view of the loaded chassis.

FIGS. 2–3C show an empty chassis 100. The empty chassis 100 has card slot covers 111 that cover each card slot reserved for a circuit card 110. The card slot covers are held in place by a screw 111' that is secured to the chassis 100. FIGS. 3A and 3C also show a backplane cover 118 that is more clearly shown in FIGS. 5A and 5B. The backplane cover 118, typically made of lexan, prevents exposure of circuit leads and pins on the backside of the backplane 106.

Figure 4A:
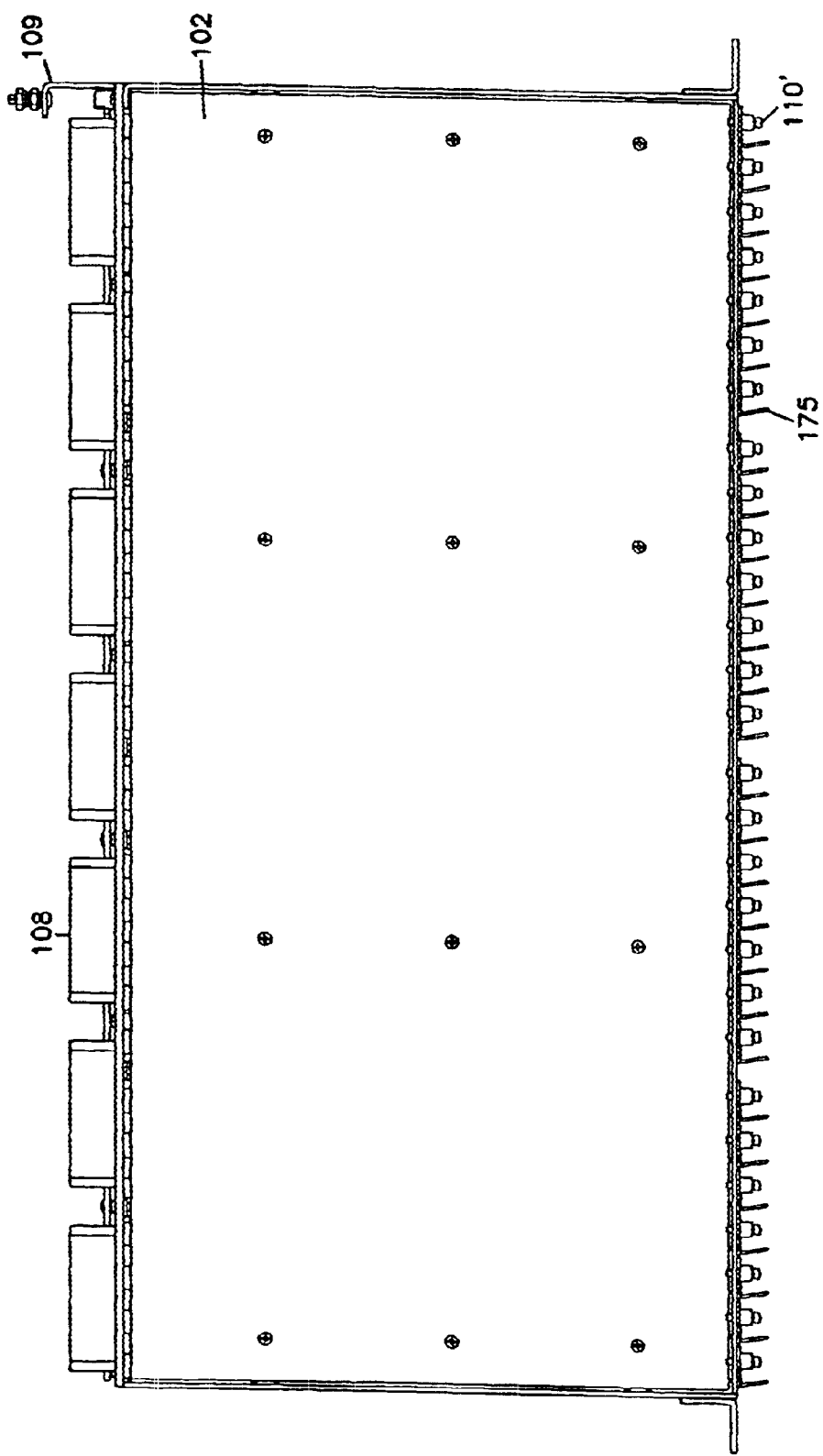
FIG. 4A is a top view of the loaded chassis.
Figure 4B:
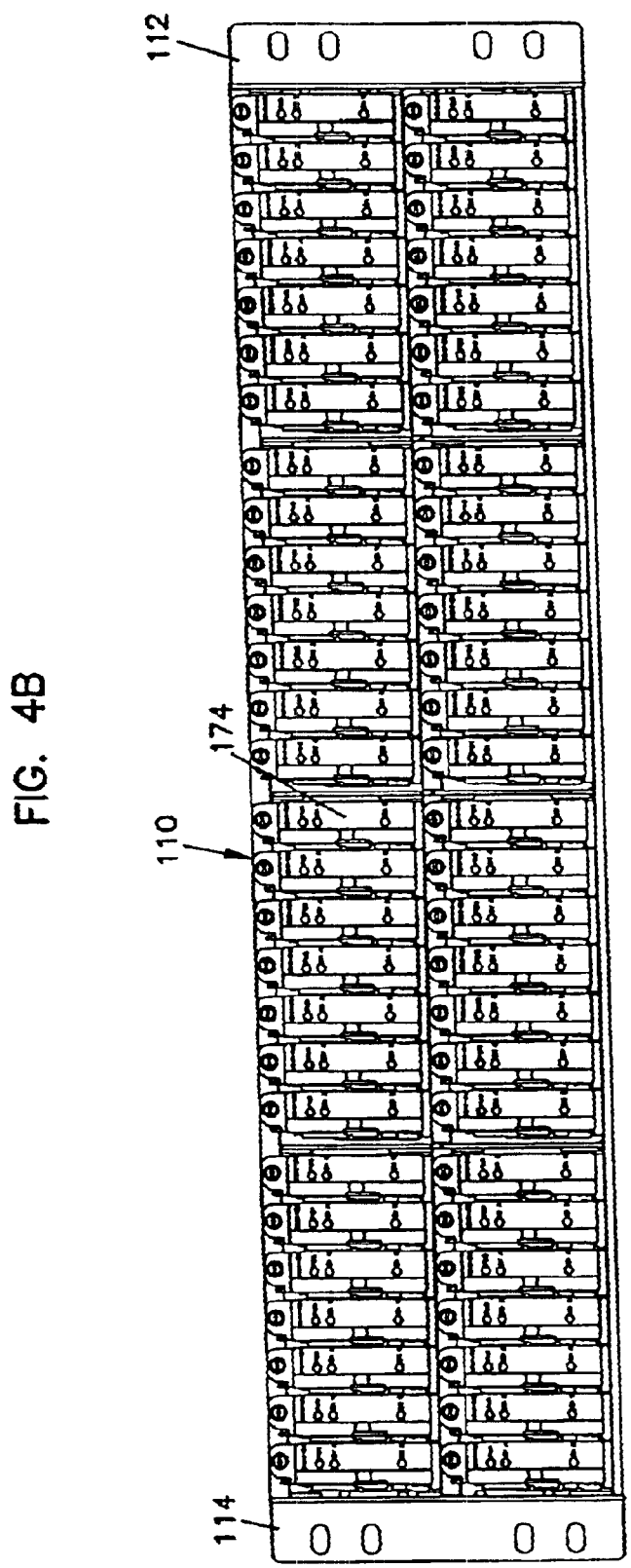
FIG. 4B is a front view of the loaded chassis.
Figure 4C:
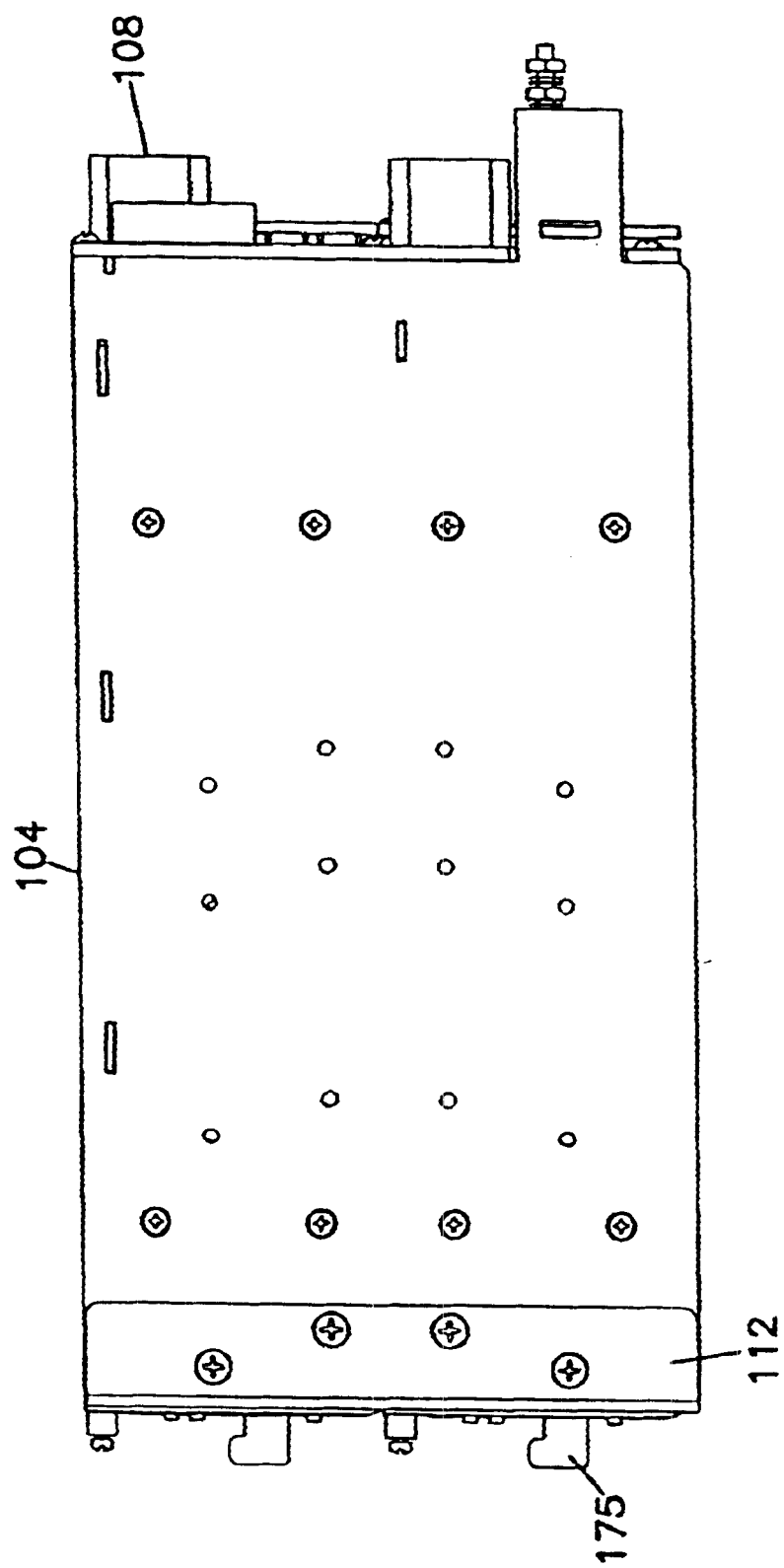
FIG. 4C is a right side view of the loaded chassis.

FIGS. 4A–C show a loaded chassis 100. The loaded chassis 100 is filled with circuit cards 110 held in place by the fastener 110'. The circuit cards 110 have a finger 175 extending from a faceplate 174. The finger 175 provides a handle for an operator to grip when inserting or removing the circuit cards 110 from the chassis 100. The finger 175 and circuit card are shown and described in more detail below.

FIGS. 5A–6C illustrate the chassis 100 with the focus shifted to the rear portion where the backplane 106, external connectors 108, and backplane cover 118 are located. The vertical sidewall 105 is also visible in these views. Also visible in these views is a backplane power connection 106' that generally mates to a power connection in a rack to provide power to circuit cards 110 through internal connectors discussed below.

FIG. 7 shows a side view of the chassis 100 with the sidewall 104 removed. As can be seen, the chassis 100 consists of several layers including the top mesh cover 102, an air gap 103, a second mesh cover layer 121, a top surface 132, a middle floor 134, and the bottom surface 138. The second mesh cover layer 121 overlays the top surface 132, and the top mesh cover 102 overlays the second mesh cover layer 121. The air gap 103 is established by ridges 130 formed in the top surface 132 that create recessed portions 131 in the top surface. Cover projections 123 are provided to maintain spacing between cover layer 102 and the second mesh cover layer 121. The sidewalls 104, 105, the middle floor 134, and the top surface 130 and bottom surface 138 are held together by fasteners 132', 142', 140', and 138'.

The middle floor includes a top plate 142 and a bottom plate 140 separated by an air gap 143. The top plate 142 overlays the bottom plate 140. Similar to air gap 103, ridges 158 in the bottom plate 140 create recessed portions 141 that establish the air gap 143 in the middle floor 134. The bottom mesh cover 116 directly underlays the bottom surface 138. The relationship of these layers relative to the inner housing 101 is further illustrated in FIG. 8.

Figure 8:
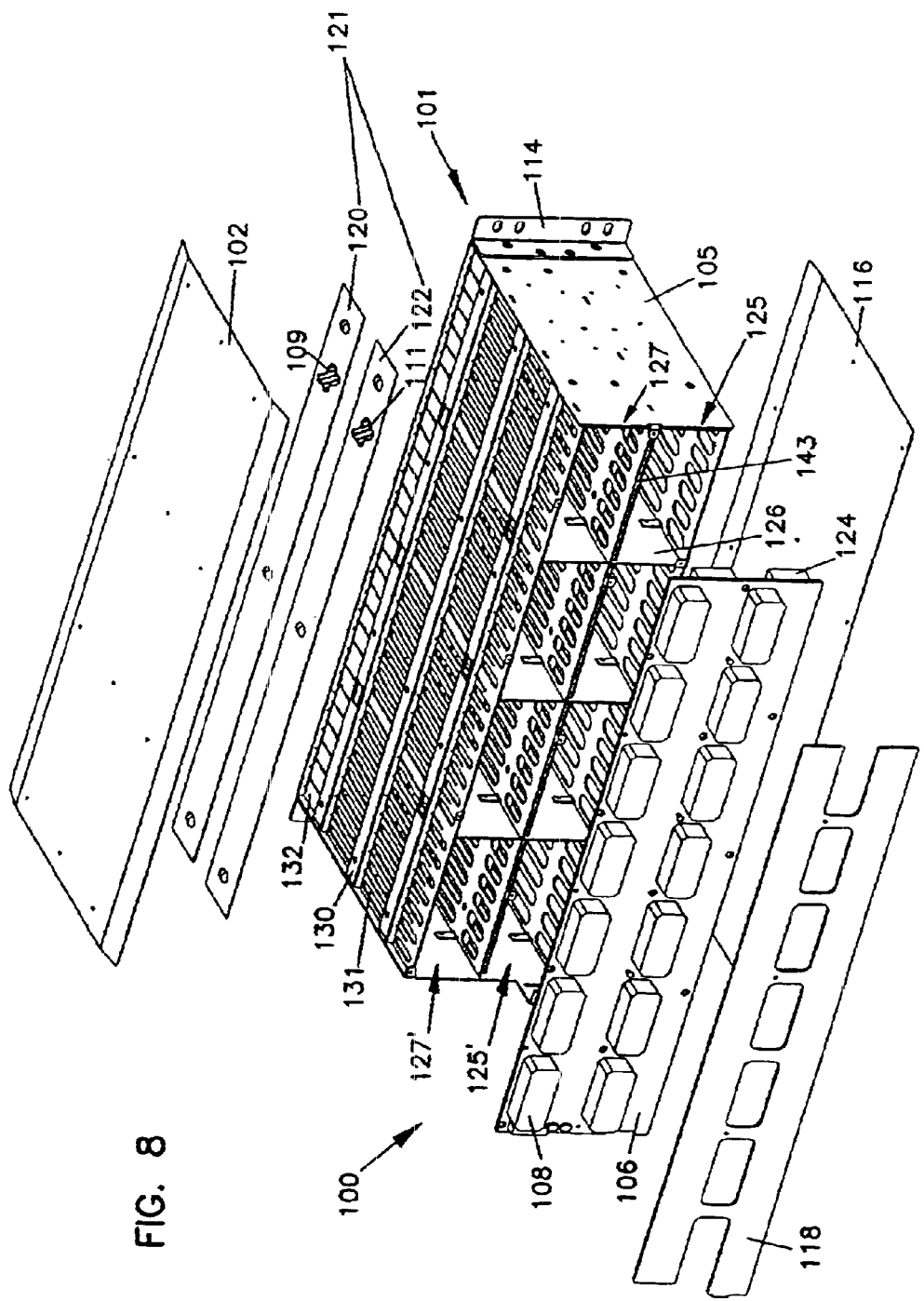
FIG. 8 is an exploded top rear perspective view of the empty chassis.

FIG. 8 shows the exploded view from a top rear perspective of the chassis 100. The second mesh cover layer 121 is shown as two individual strips of mesh material. Although the mesh attributes 109 and 111 of mesh strips 120 and 122 are depicted only in FIG. 8, the mesh strips 120 and 122 and corresponding second mesh cover layer 121 may be regarded as possessing mesh attributes 109 and 111 in all subsequent drawings. These two strips 120 and 122 lie within the recesses 131 formed in the top surface 132 between the ridges 130. Inner sidewalls 126 within inner housing 101 are also visible in FIG. 8. These inner sidewalls 126 create compartments 125 and 127 within a bottom chamber 125' and top chamber 127', respectively, within the inner housing 101. Internal connectors 124 located on the inner side of backplane 106 are also visible and are used to mate with the circuit card 110. The air gap 143 in the middle floor 134 is also shown.

Figure 9:
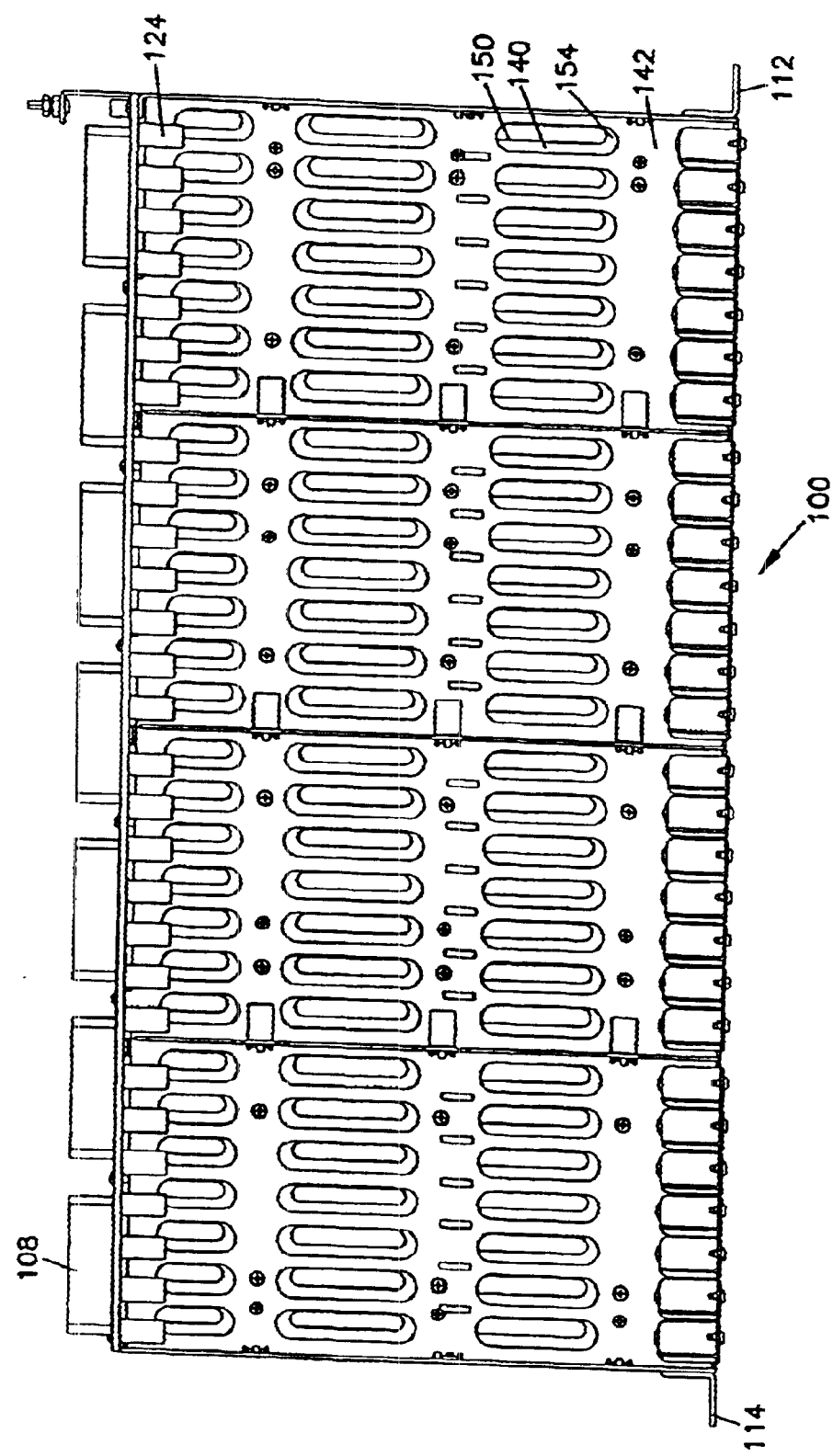
FIG. 9 is a top view of the empty chassis with the top cover layers and top surface of the inner housing removed.

FIG. 9 shows a top view of the chassis 100 with the top cover 102, second mesh cover layer 121, and the top surface 132 of the inner housing 101 removed. The top plate 142 is visible and openings including slots 154 are visible. The bottom plate 140 is partially visible through the slots 154 where the bottom plate's slots 150 are not in perfect alignment due to shape, position, or size with the slots 154 of the top plate 142. As described below, these slots 150 and 154 permit heat from circuit cards 110 in bottom chamber 125' to be dissipated while containing flames emanating from the bottom chamber 125'.

Figure 10:
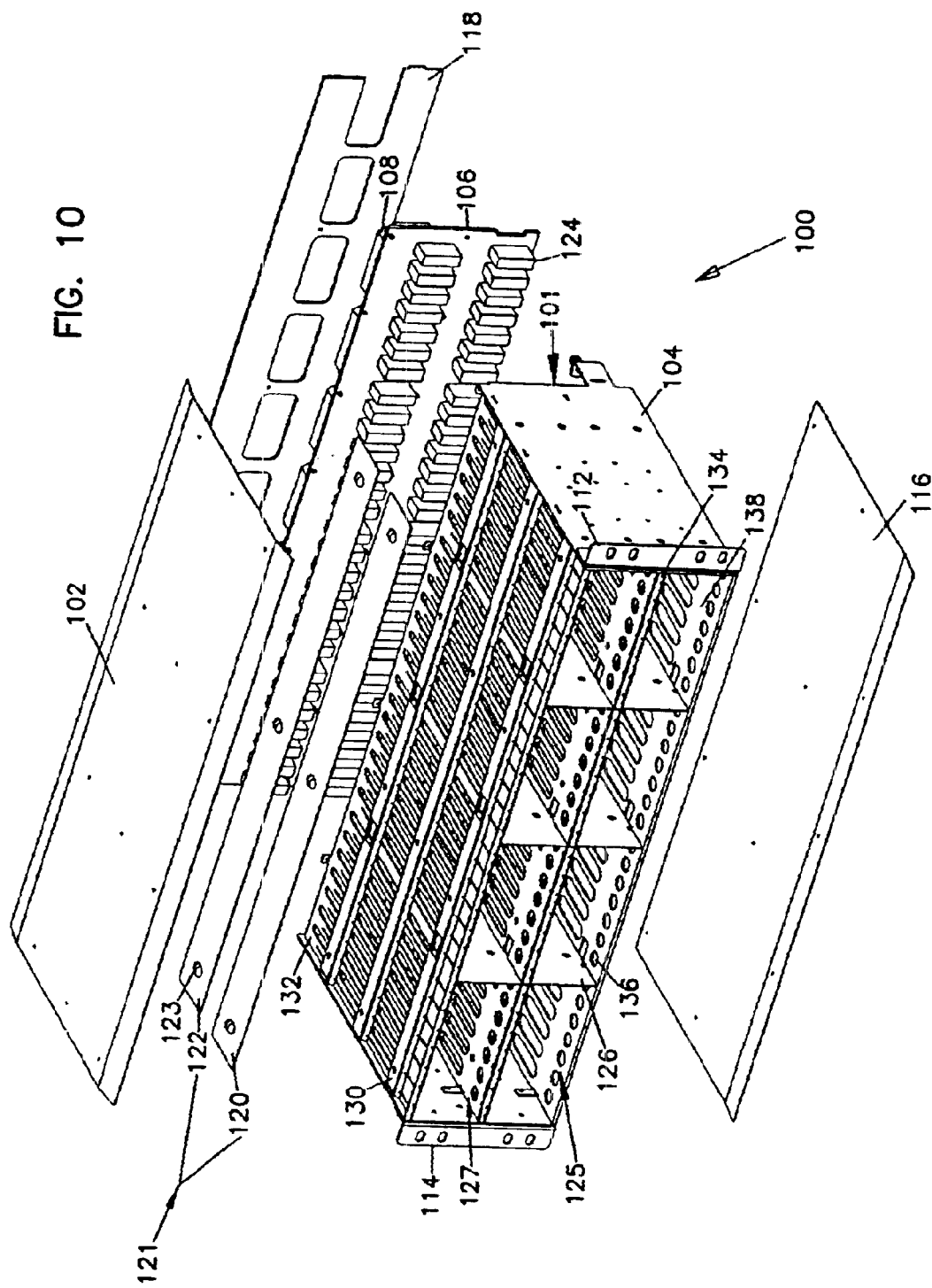
FIG. 10 is an exploded top front perspective view of the empty chassis.

FIG. 10 shows an exploded view of the chassis 100 with the inner housing intact from a top front perspective. The internal connectors 124 are shown. The internal connectors fit within the compartments 125 and 127 and the circuit cards 110 slide into the inner housing 110 from the front. A connector on the circuit card 110 then slides into engagement with the internal connector 124. Generally, one card corresponds to one internal connector 124. As shown, seven cards fit into a single compartment 125 or 127. Also shown in FIG. 10 are cover projections 123 on the second mesh cover layer 121 formed by the individual mesh strips 120 and 122. The cover. The cover projections 123 assist in maintaining the air gap 103 formed between the top mesh cover 102 and the mesh strips 120, 122.

Figure 11A:
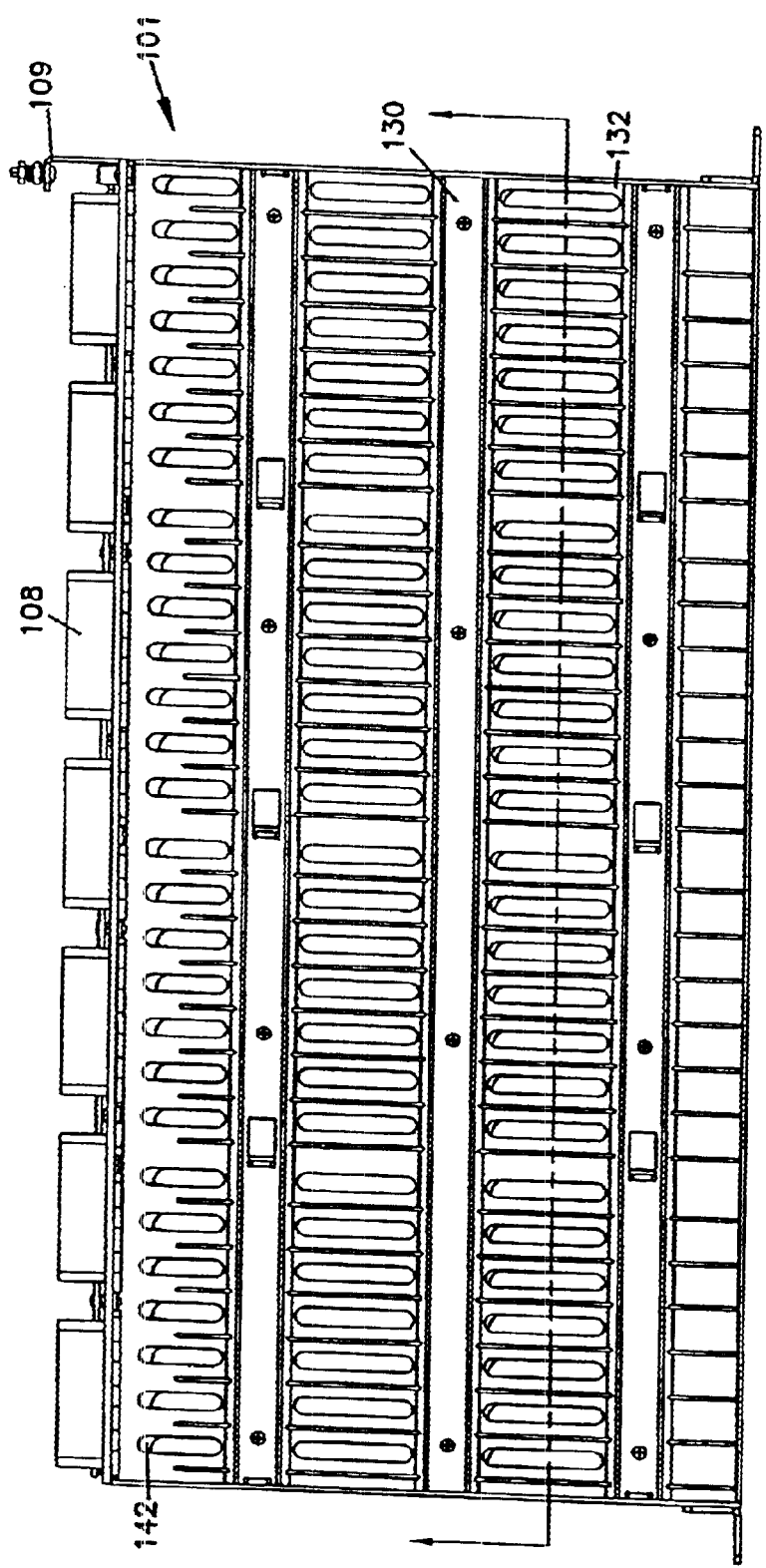
FIG. 11A is a top view of the empty inner housing of the empty chassis.
Figure 11B:
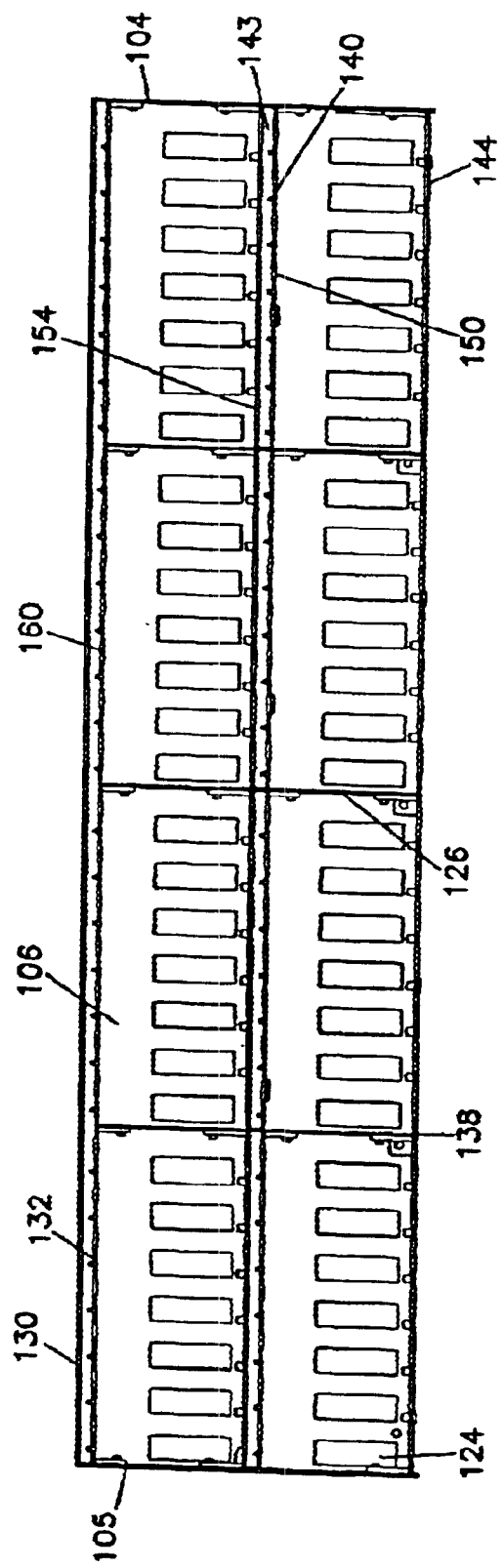
FIG. 11B is a cross-sectional front view of the empty inner housing of the empty chassis along lines A—A of FIG. 11A.
Figure 11C:
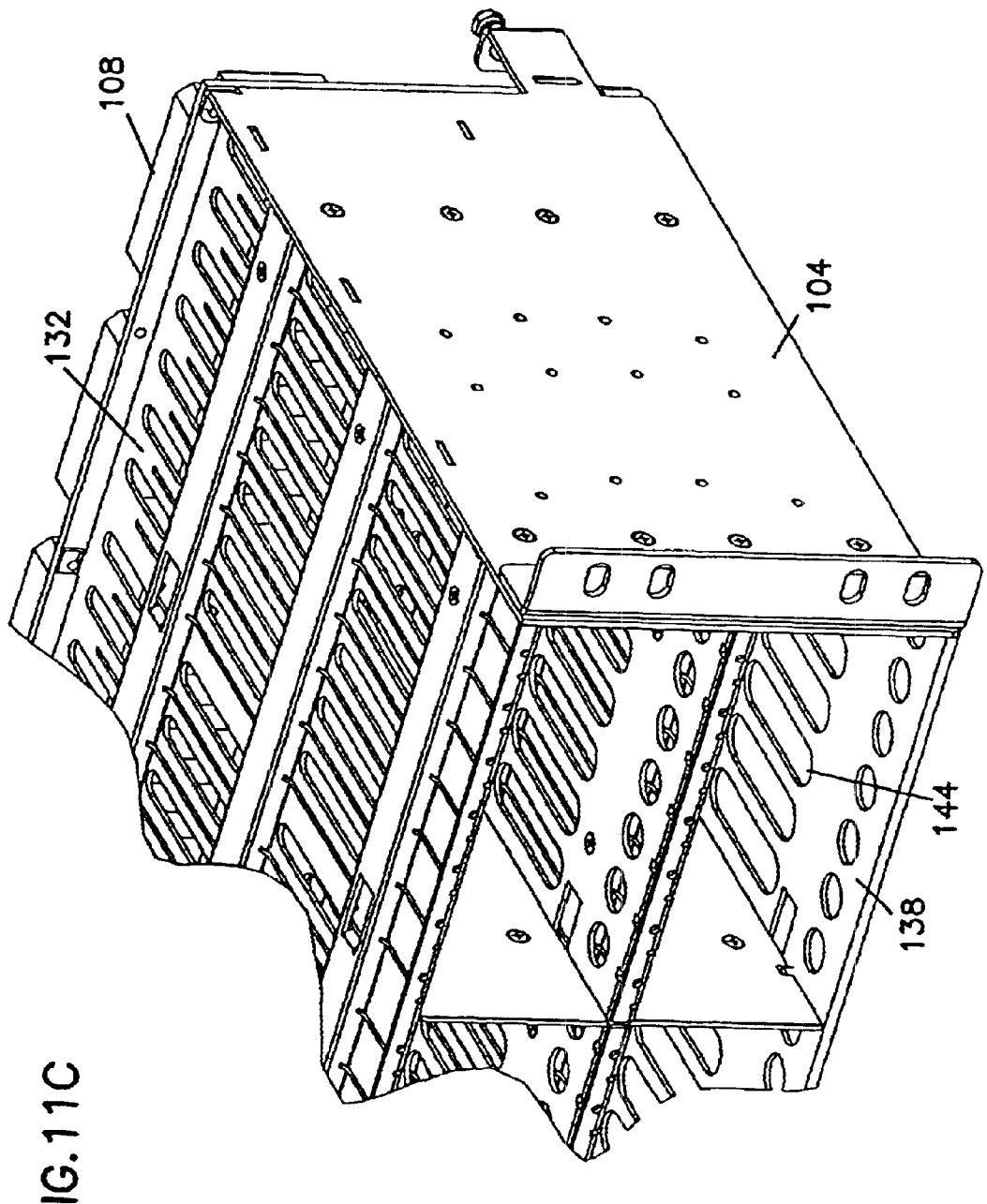
FIG. 11C is a partial top front perspective view of the empty inner housing of the empty chassis.
Figure 12:
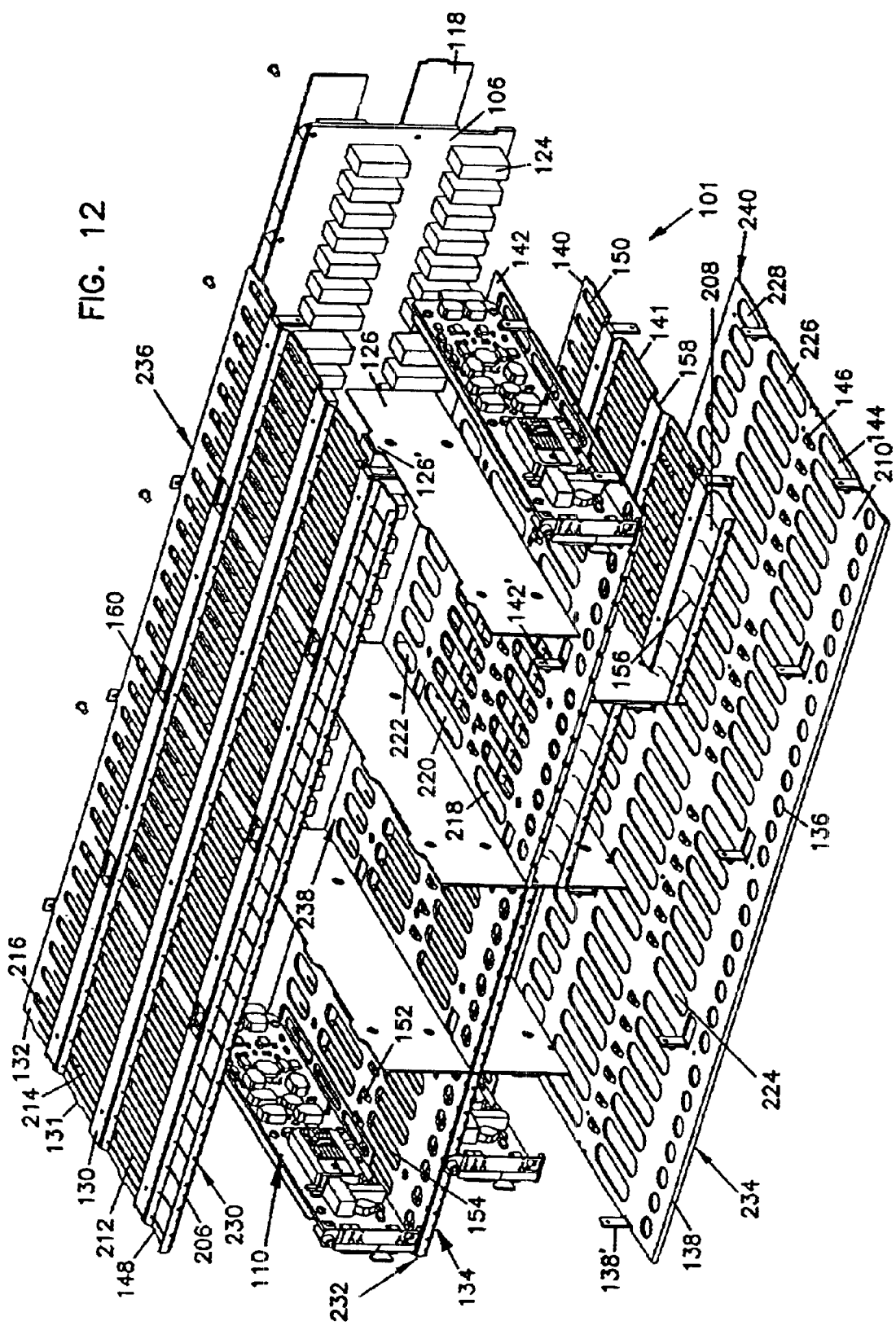
FIG. 12 is a top front exploded perspective view of the inner housing of the chassis loaded with three cards.
Figure 13:
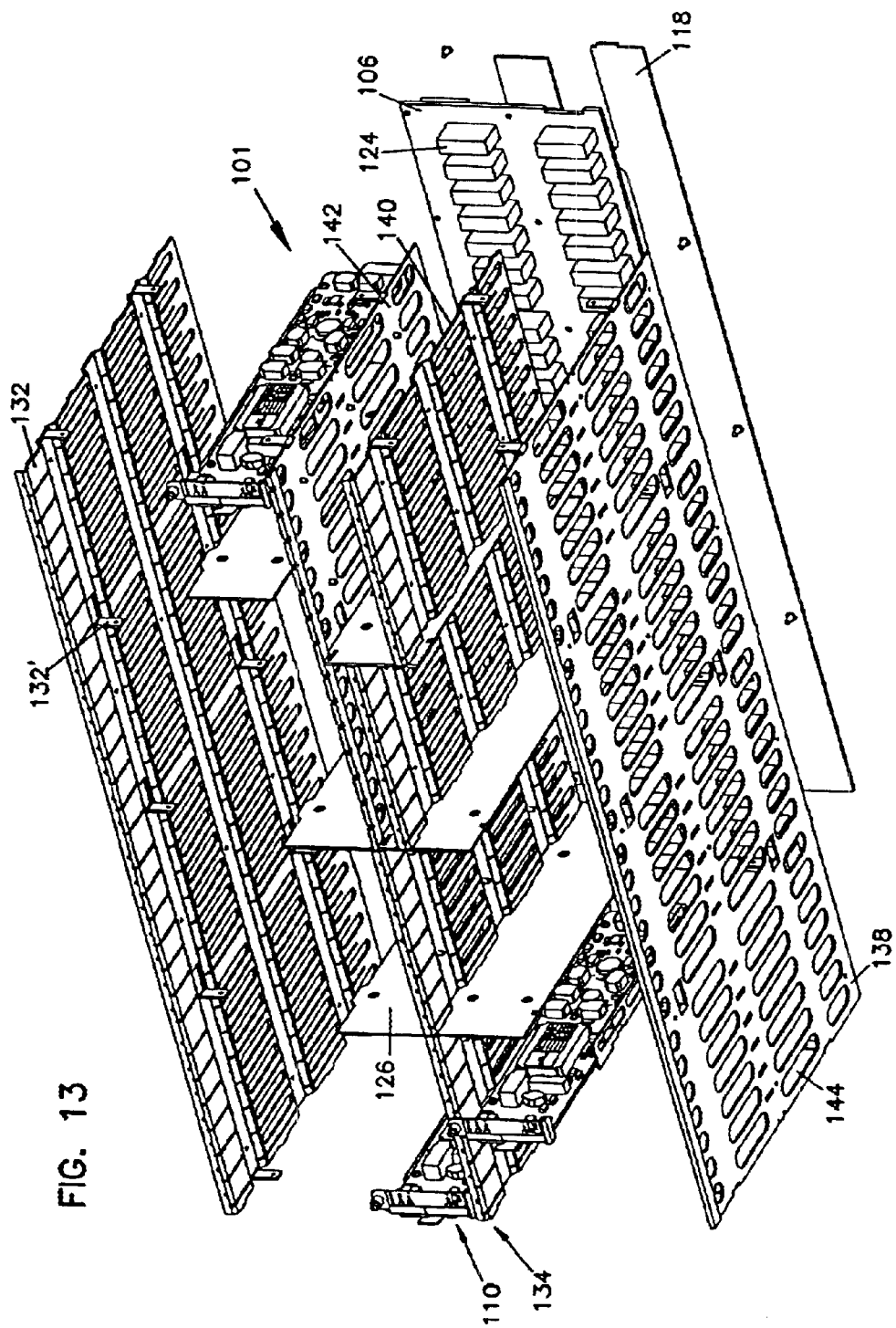
FIG. 13 is a bottom front exploded perspective view of the inner housing of the chassis loaded with three cards.
Figure 14:
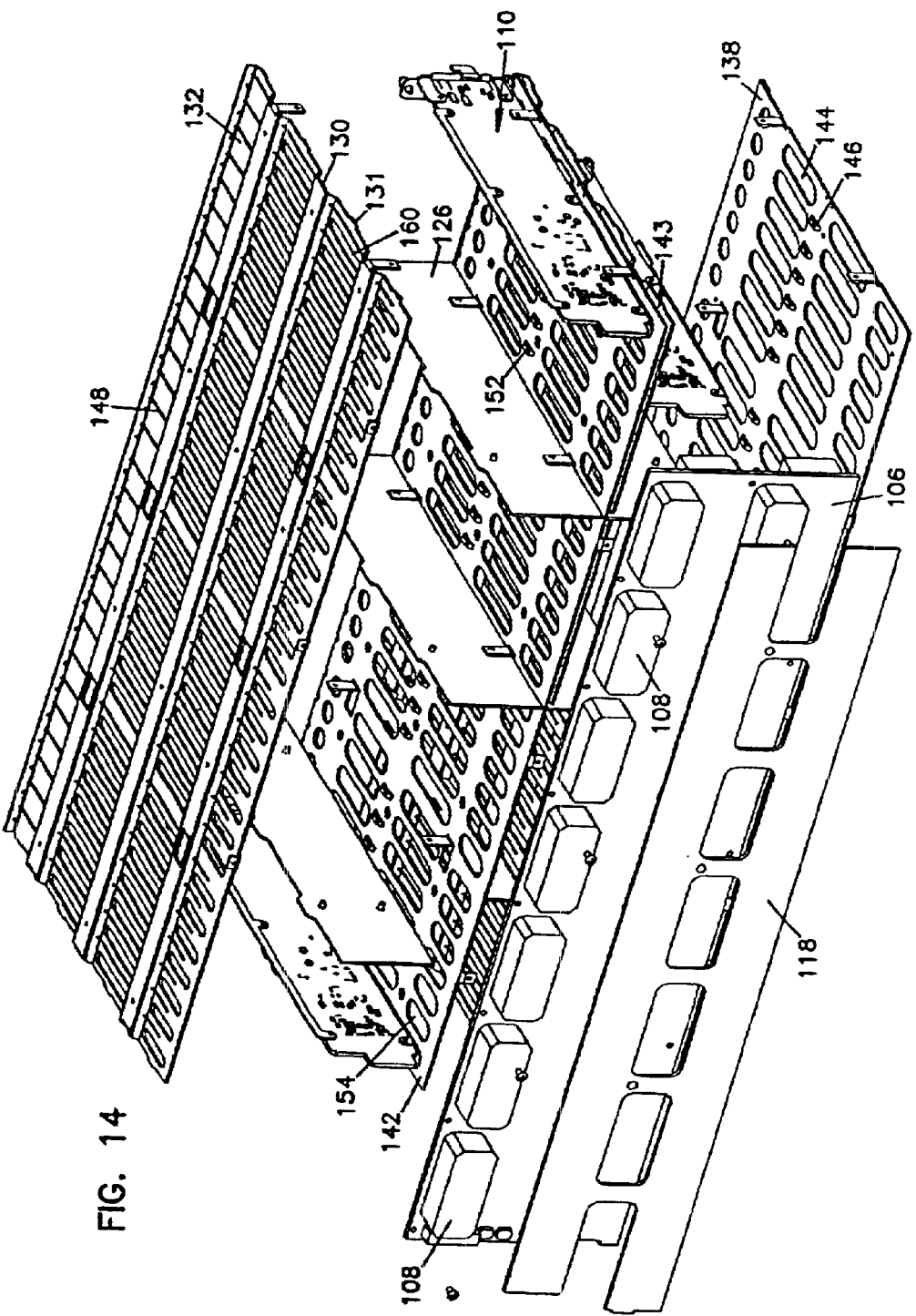
FIG. 14 is a top rear exploded perspective view of the inner housing of the chassis loaded with three cards.
Figure 15:
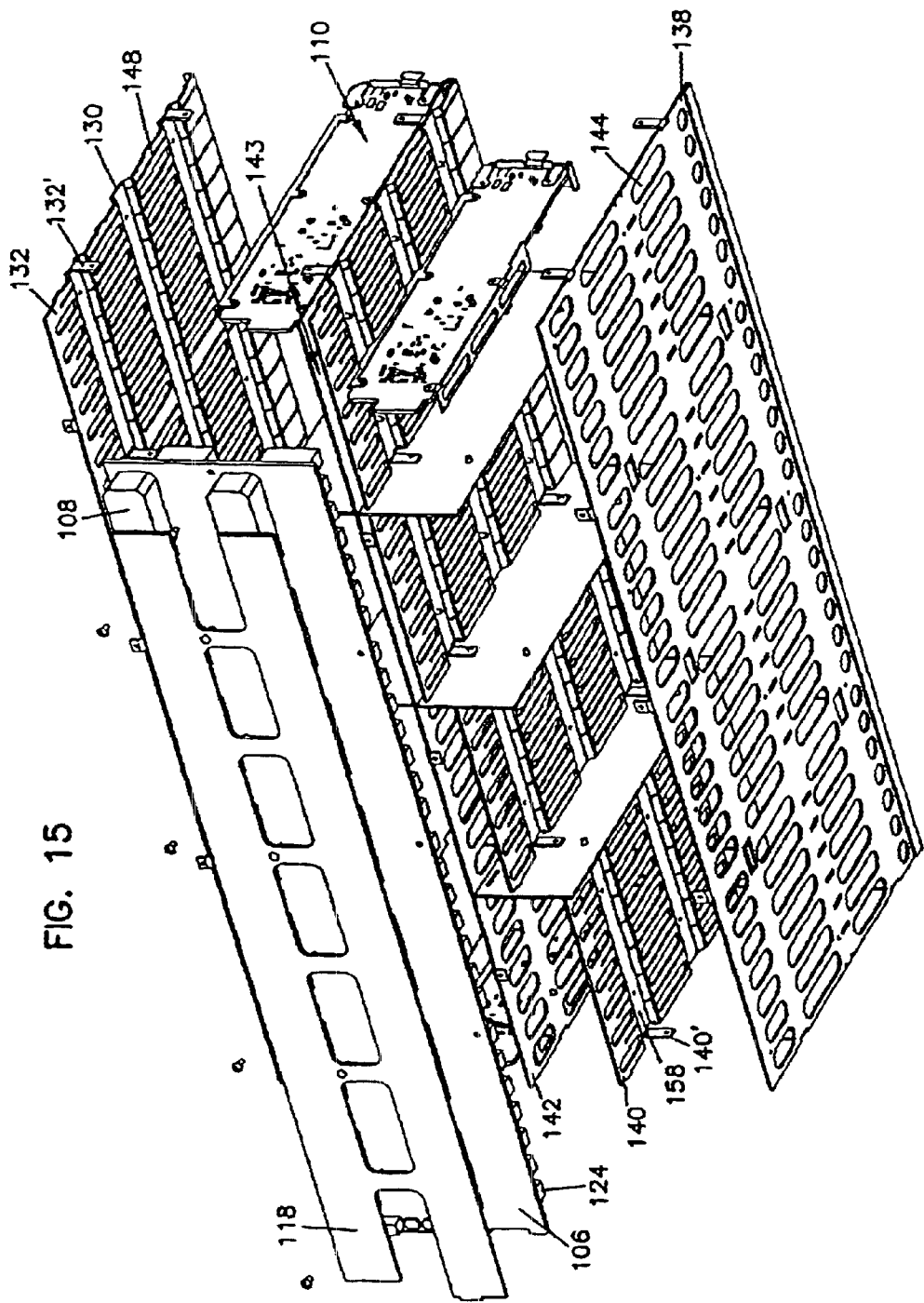
FIG. 15 is a bottom rear exploded perspective view of the inner housing of the chassis loaded with three cards.
Figure 16C:
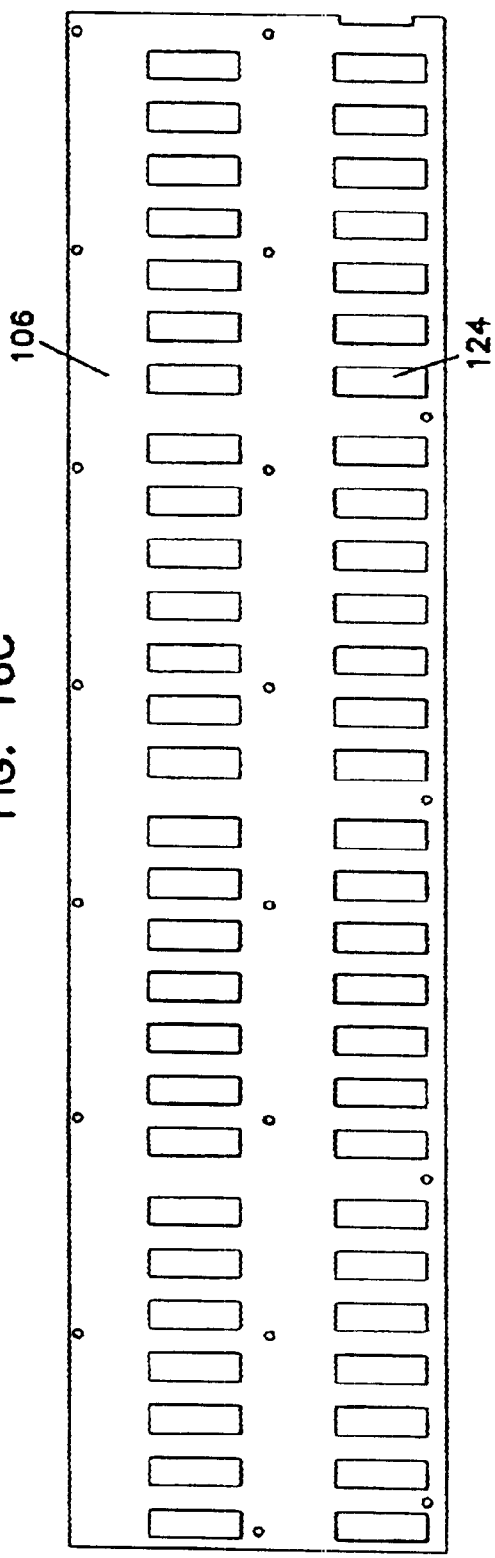
FIG. 16C is a front view of the backplane of the chassis.
Figure 16D:
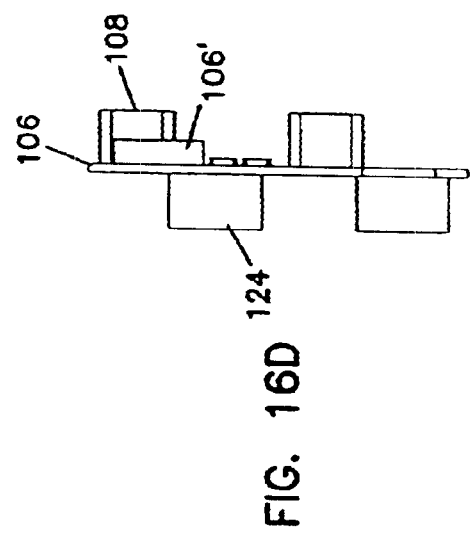
FIG. 16D is a right side view of the backplane of the chassis.
Figure 17A:
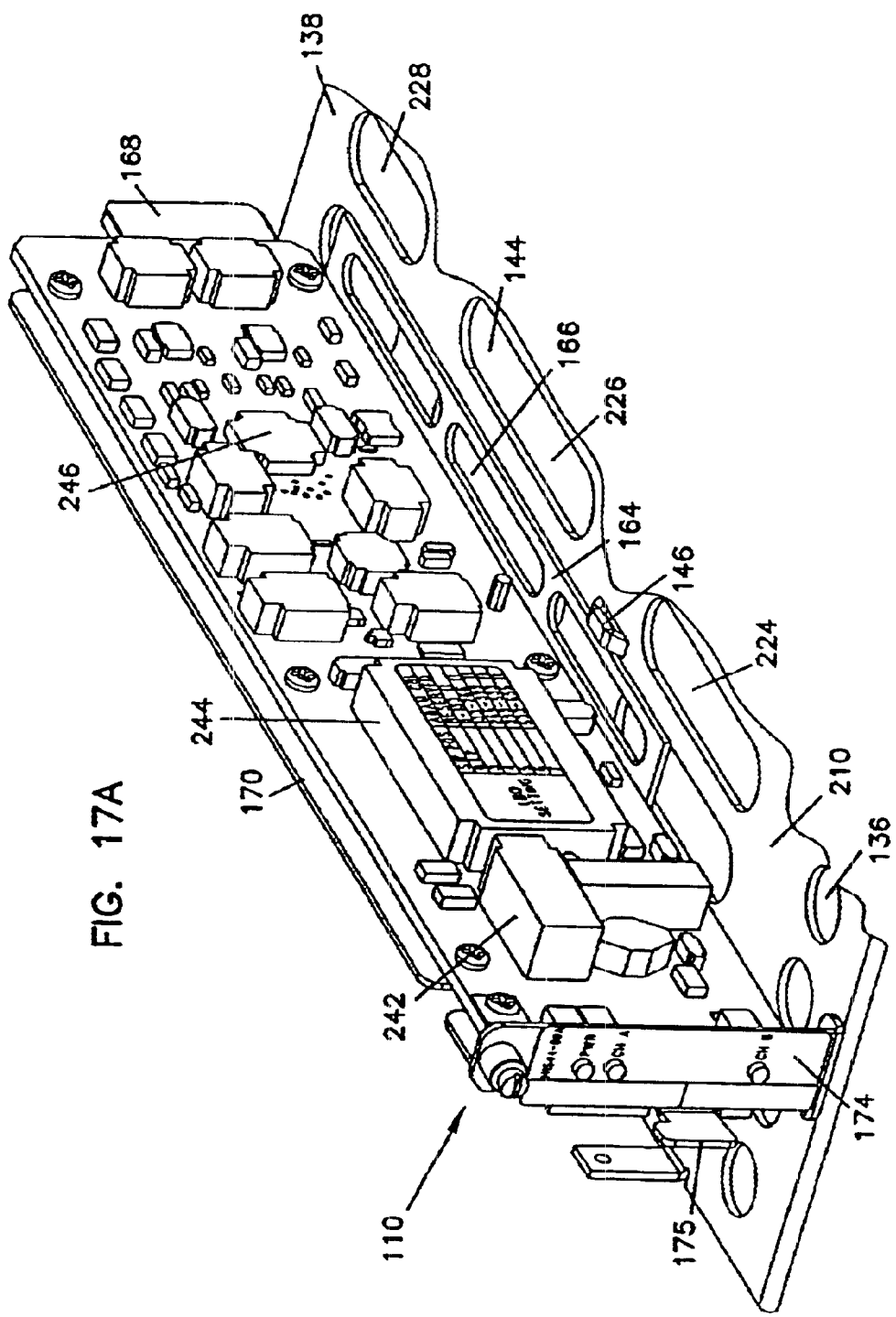
FIG. 17A is a partial top front perspective view of a card mounted to a floor surface of the inner housing of the chassis.
Figure 17B:
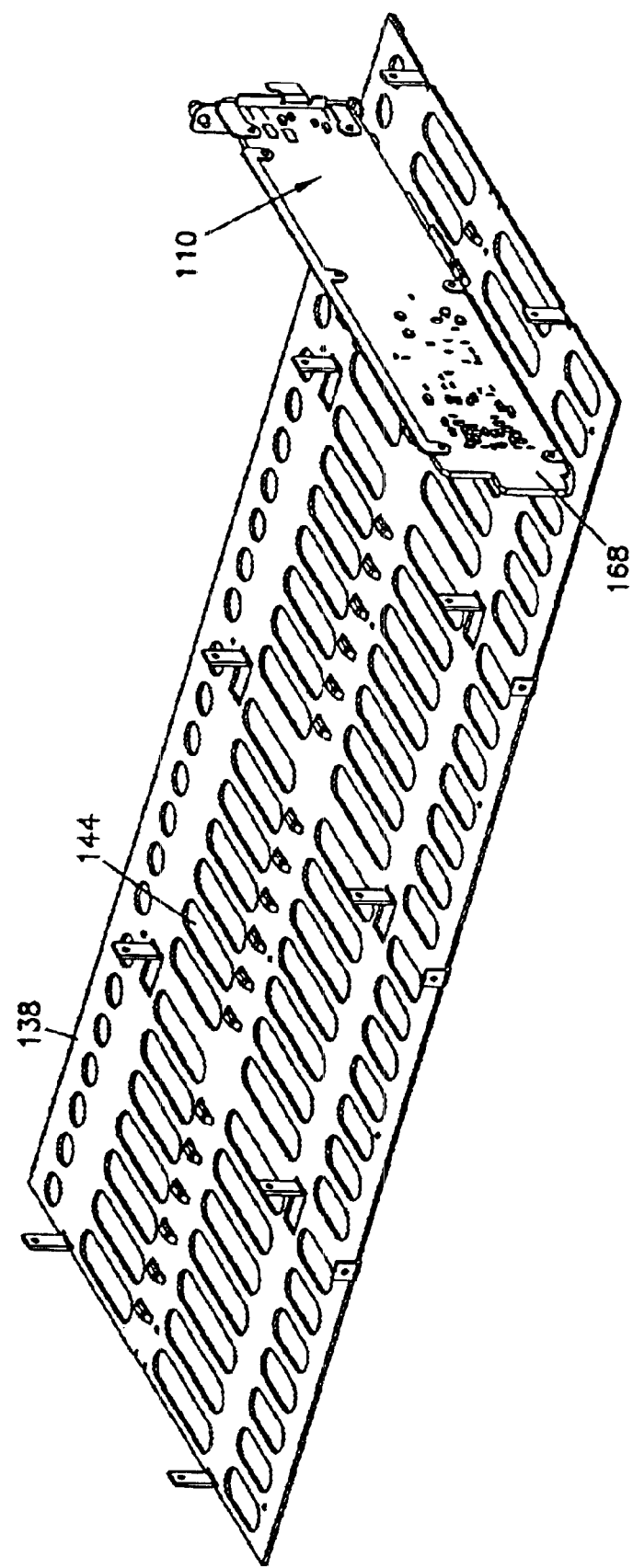
FIG. 17B is a top rear perspective view of a card mounted to a floor surface of the inner housing of the chassis.
Figure 17C:
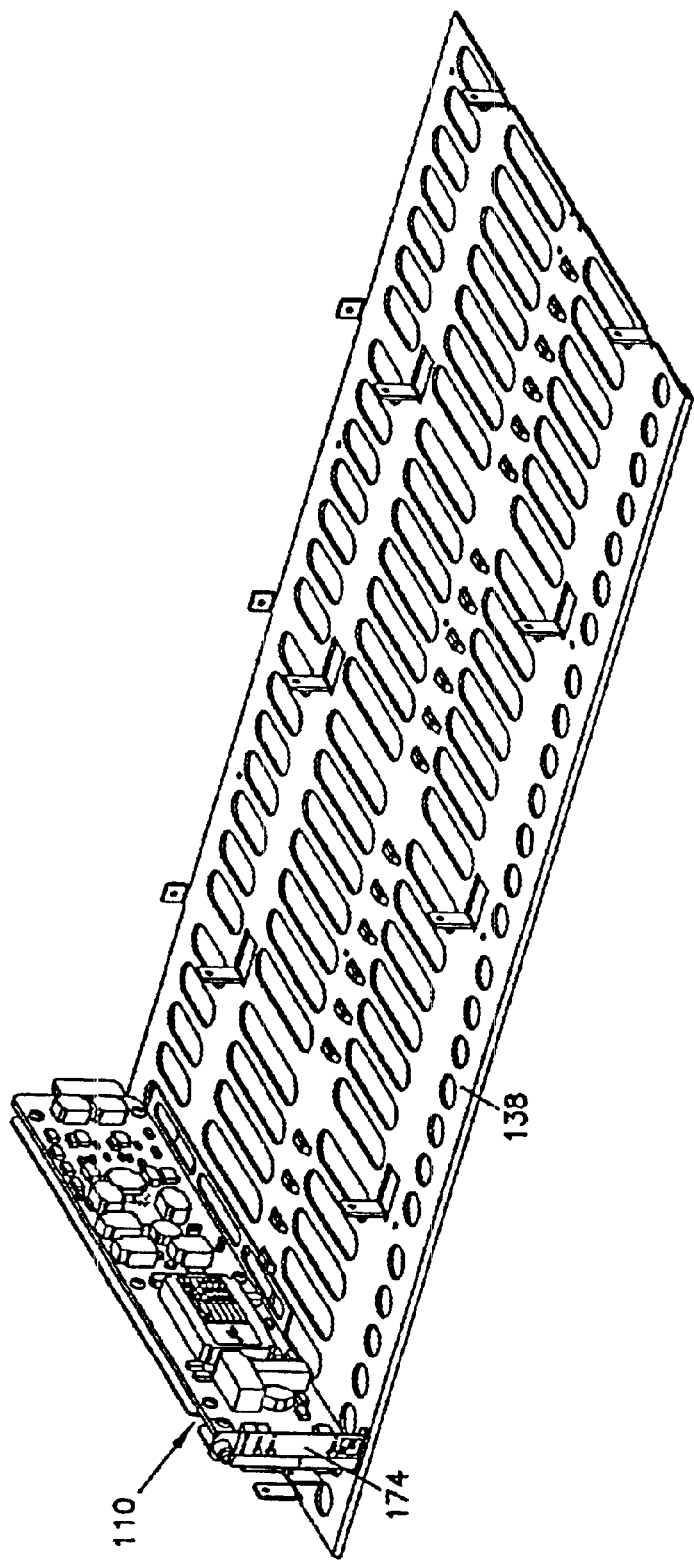
FIG. 17C is a top front perspective view of a card mounted to a floor surface of the inner housing of the chassis.
Figure 17D:
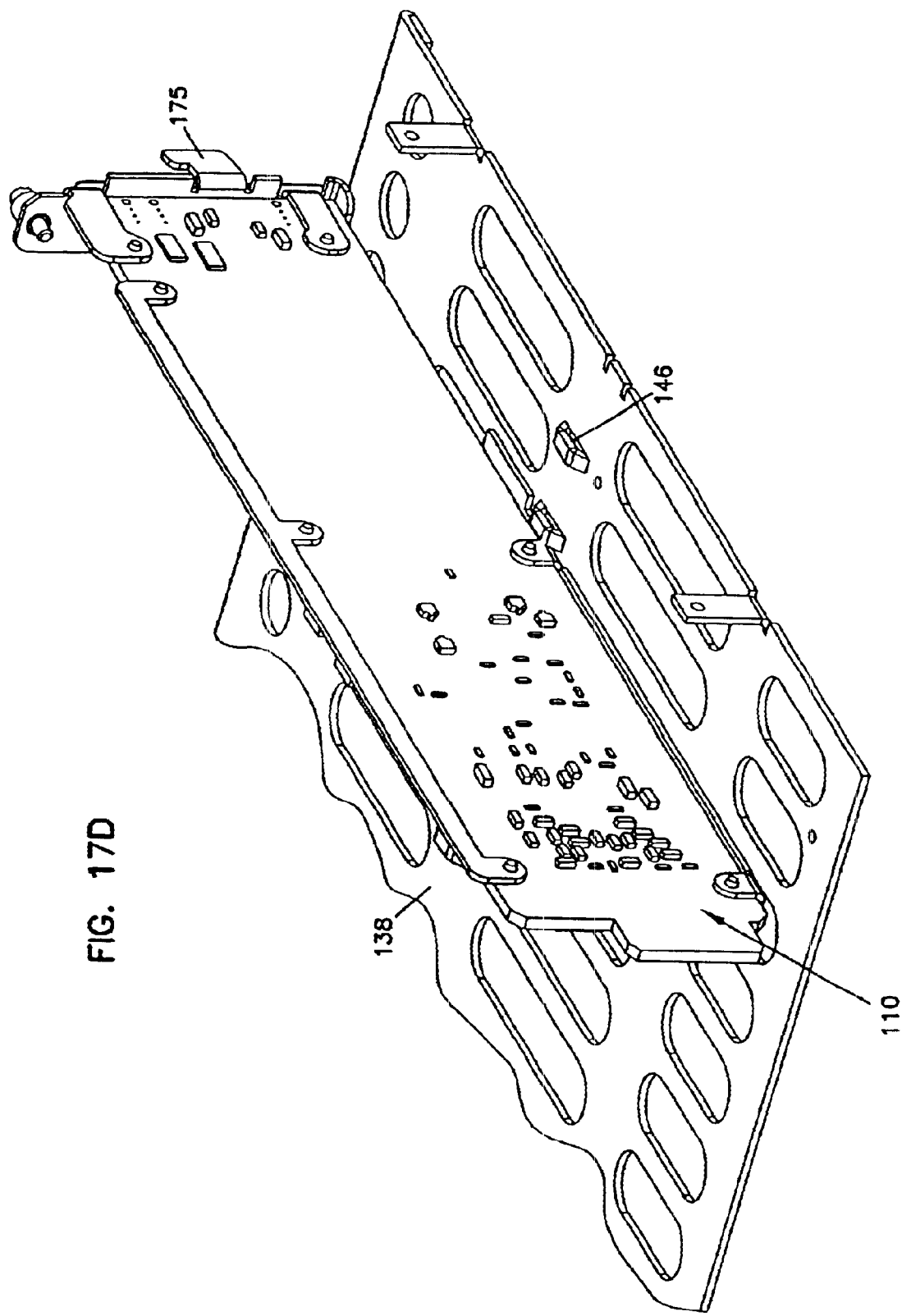
FIG. 17D is a partial top rear perspective view of a card mounted to a floor surface of the inner housing of the chassis.
Figure 18A:
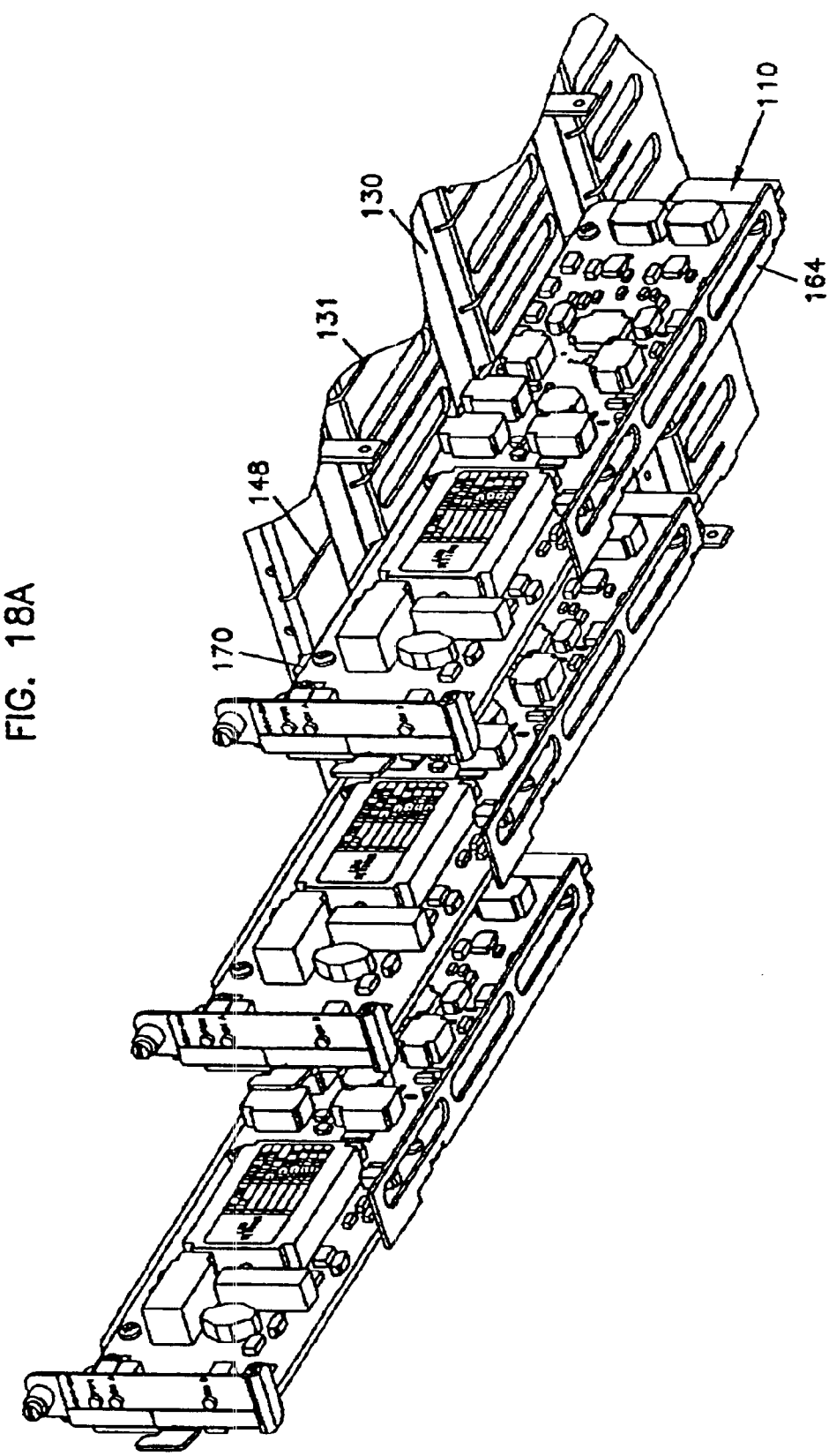
FIG. 18A is a partial bottom front perspective view of cards partially installed relative to a ceiling surface of the inner housing of the chassis.
Figure 18B:
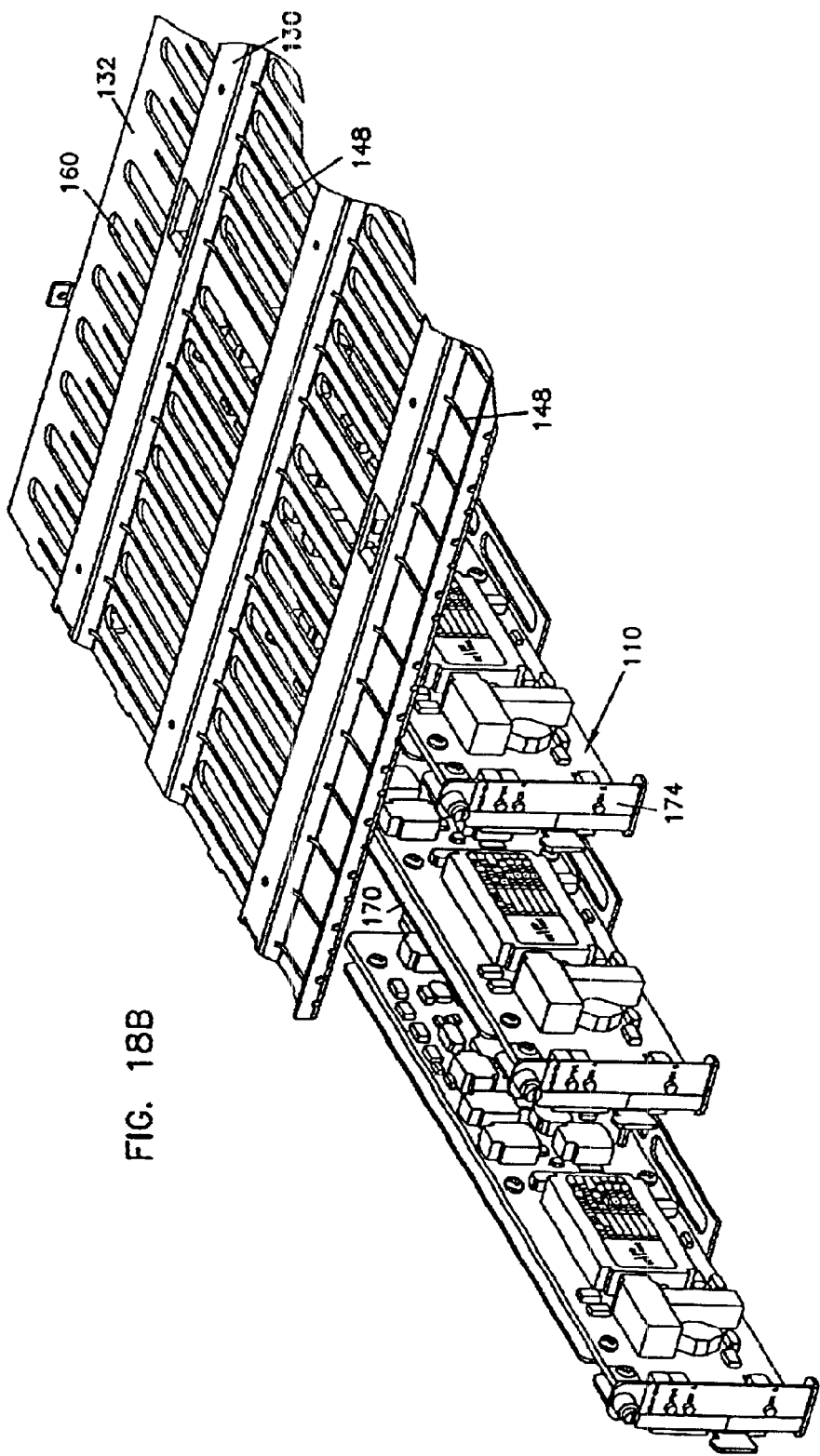
FIG. 18B is a partial top front perspective view of cards partially installed relative to a ceiling surface of the inner housing of the chassis.
Figure 18C:
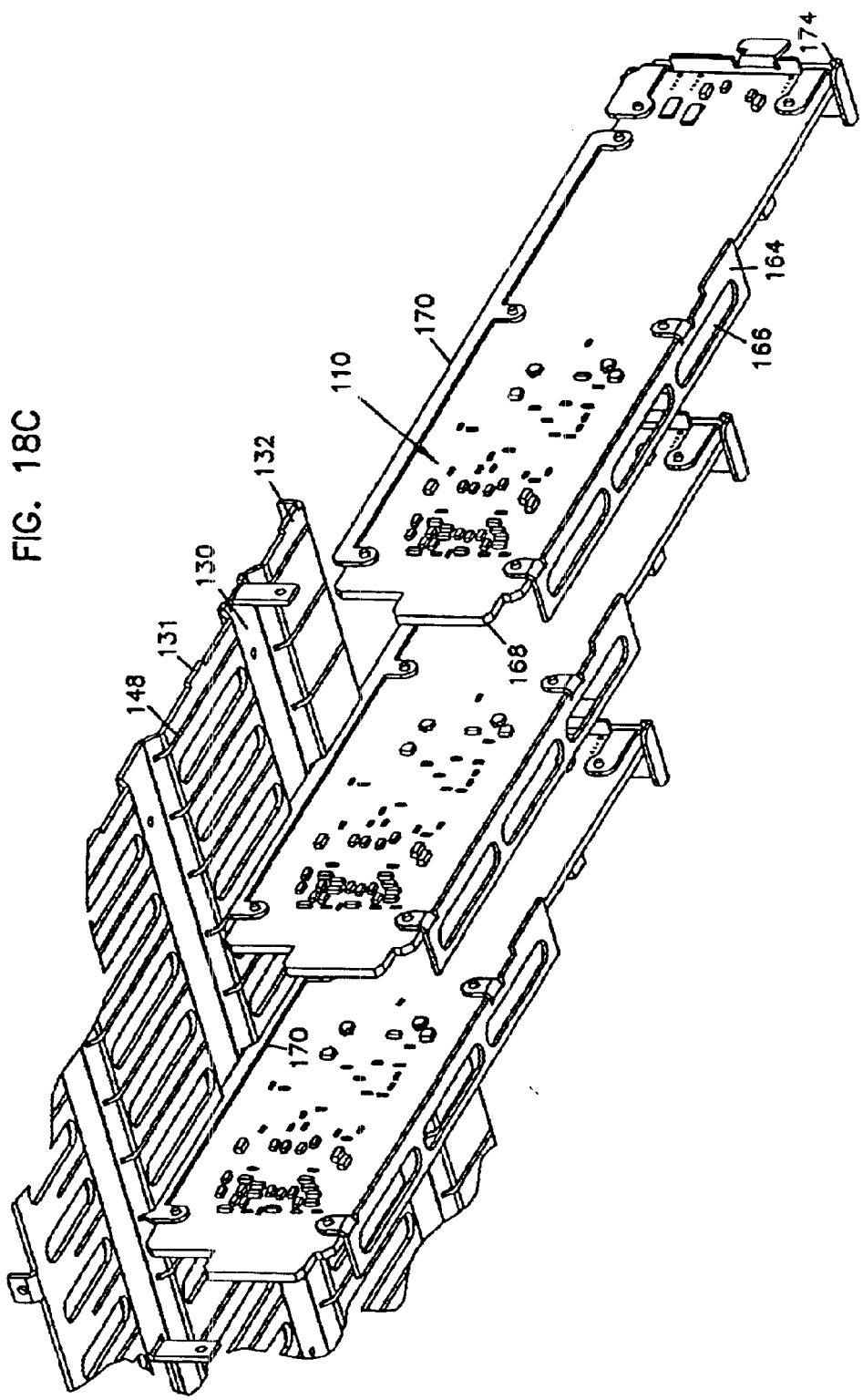
FIG. 18C is a partial bottom rear perspective view of cards partially installed relative to a ceiling surface of the inner housing of the chassis.
Figure 18D:
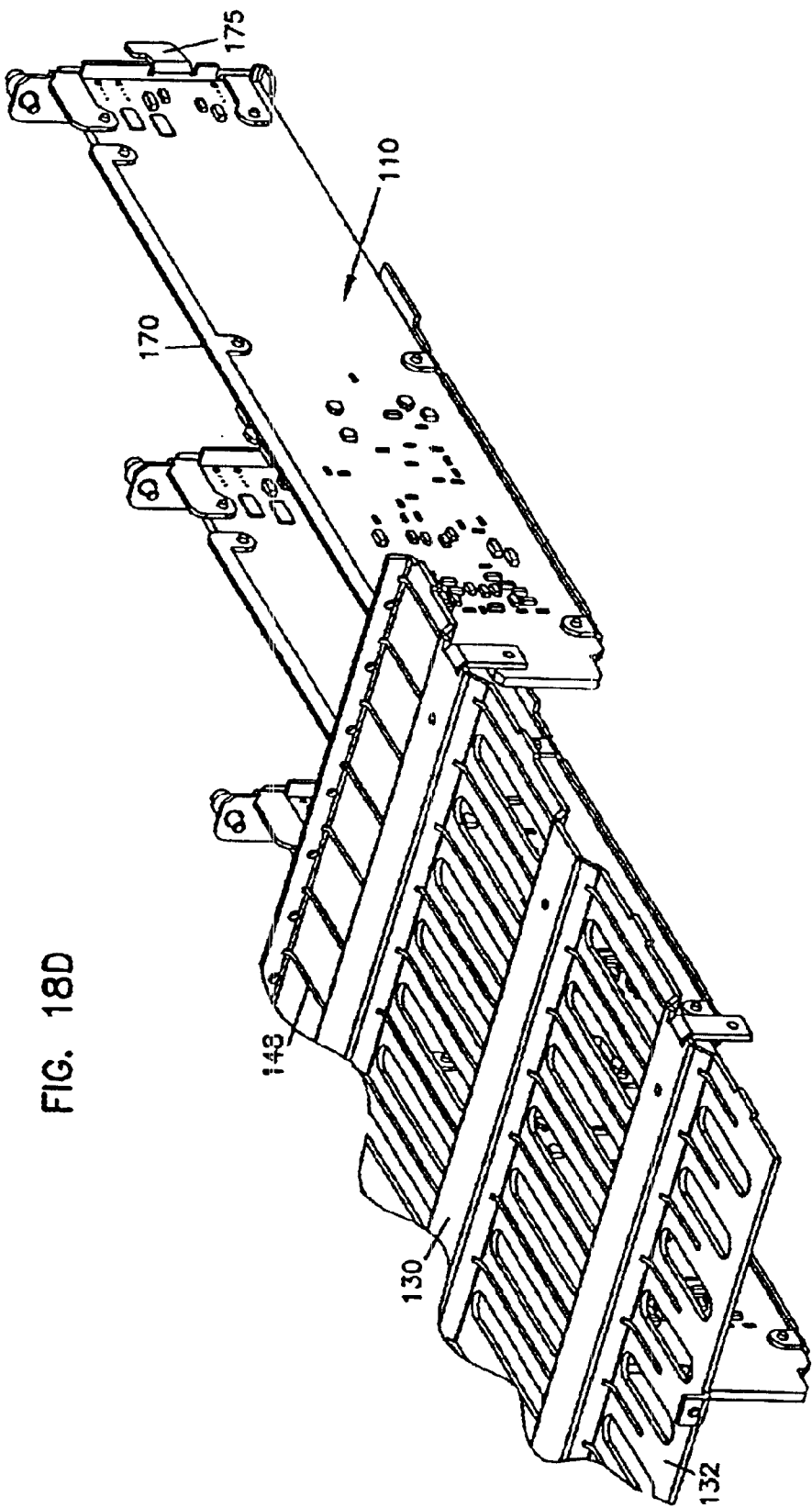
FIG. 18D is a partial top rear perspective view of cards partially installed relative to a ceiling surface of the inner housing of the chassis.
Figure 20A:
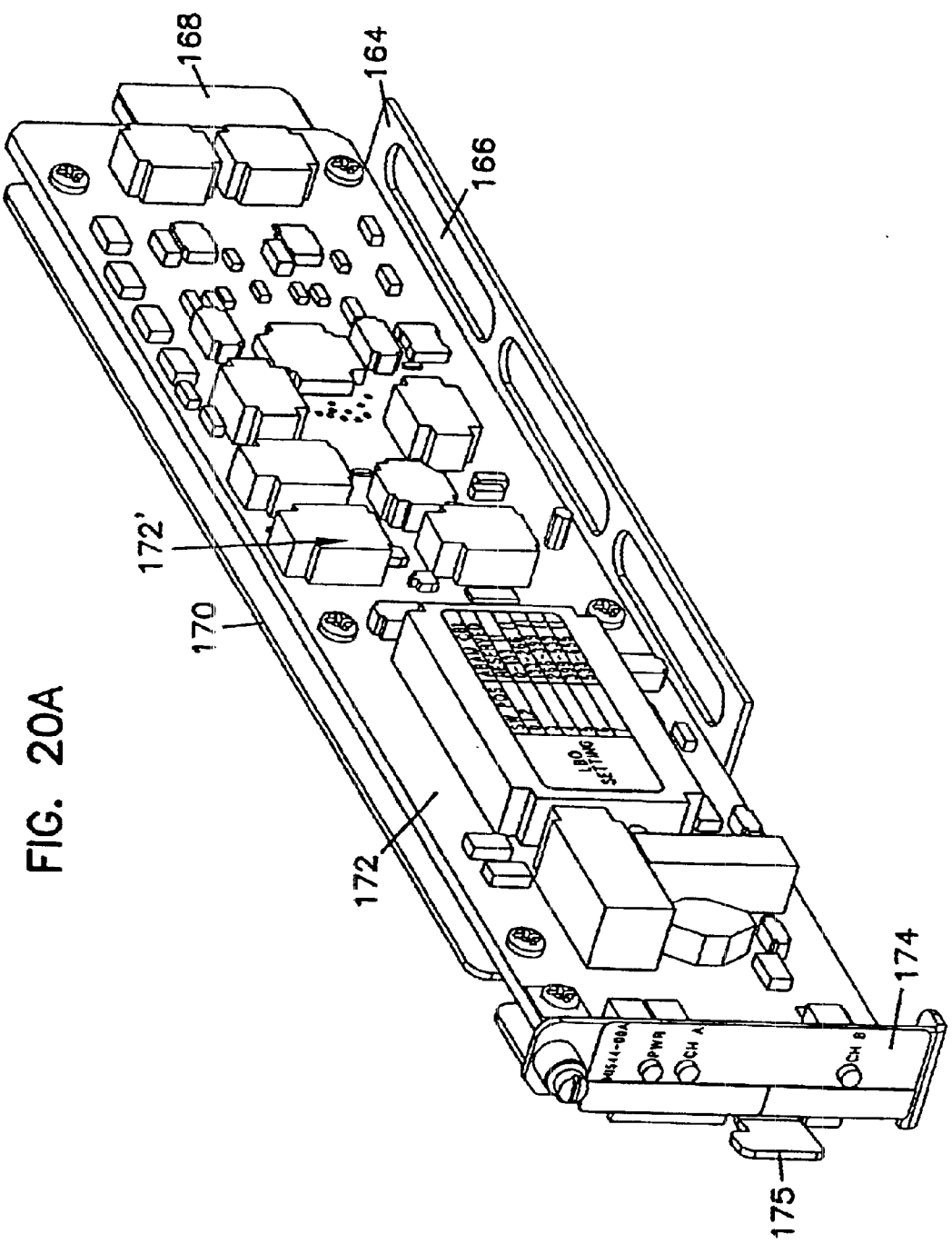
FIG. 20A is a top front perspective view of the repeater circuit card.
Figure 20C:
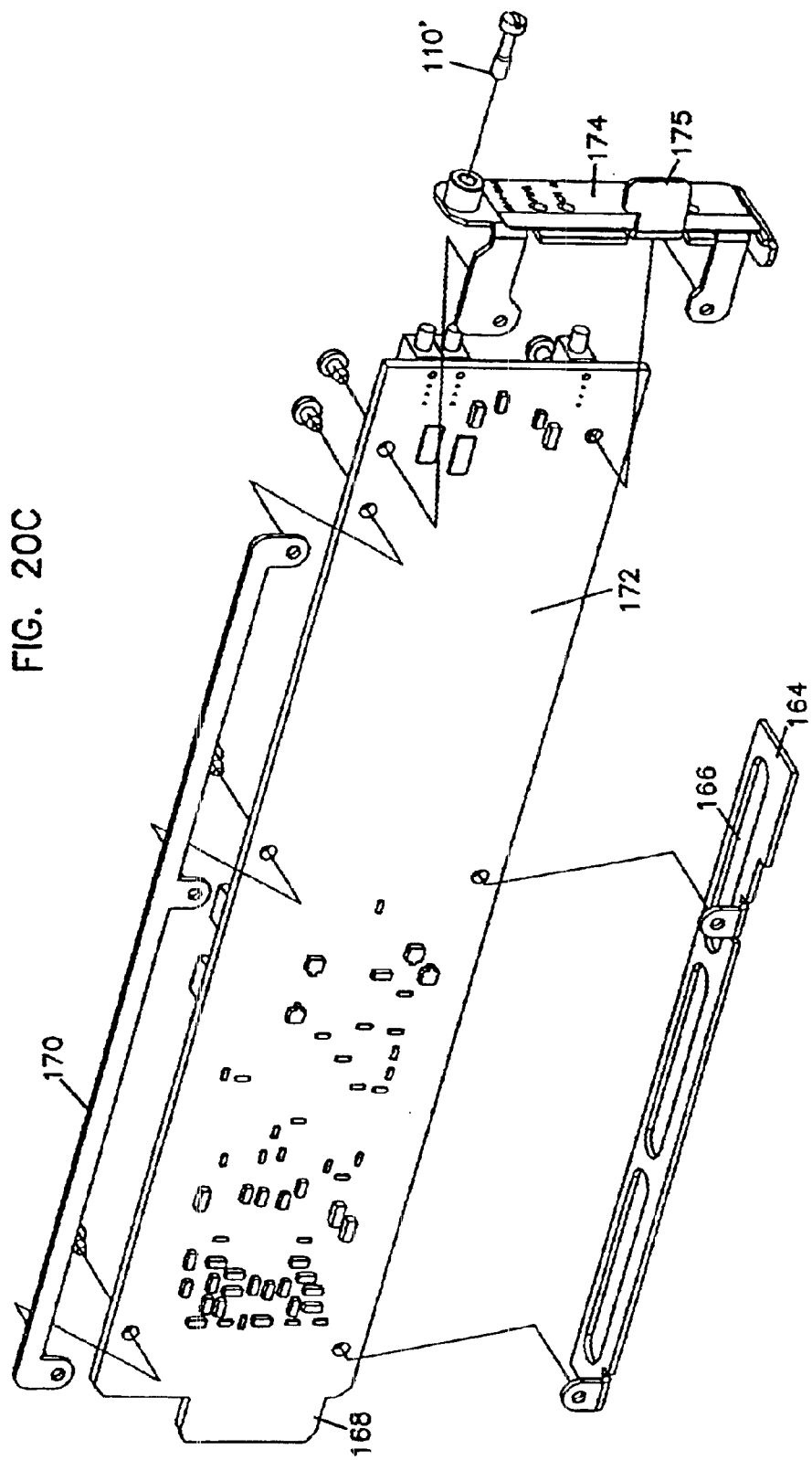
FIG. 20C is an exploded top left perspective view of the repeater circuit card.

FIGS. 11A–11C show the inner housing 101 from several views. In FIG. 11A, looking down onto the top surface 132, a slight misalignment between the slots 154 of the top plate 142 and be seen because top plate 142 is visible through slots 160 in the top surface 132 of the inner housing 101. As discussed above, misalignment of the slots may result from different sizes or shapes of the slots in one surface relative to those of another or may result from slots of the same size and shape not having a common position in one surface relative to the slot position in another surface. As shown, slots 144 in the bottom surface 116 and slots 154 in the top plate 142 have the same size, shape and common position and are aligned but misaligmnent is introduced by slots 150 in bottom plate 140 because slots 150 in the bottom plate have a different size. Similarly, slots 150 in the bottom plate and slots 160 in the top surface have the same size, shape, and common position and are aligned, but slots 154 in the top plate have a different size and therefore, introduce misalignment. This misalignment facilitates the flame containment while allowing heat dissipation to occur.

FIG. 11B shows a front cross-sectional view taken through line A—A of FIG. 11A. The air gap 143 can be seen in this view. Also visible is the side-to-side alignment of openings 144 and 154 in the bottom surface 116 and the top plate 142, respectively. The side-to-side alignment of openings 150 and 160 in the bottom plate and the top surface, respectively, can also be seen. Misalignment between openings 144 and 150, between openings 150 and 154, and between 154 and 160 is visible as well.

FIGS. 12 through 15 show exploded views of the inner housing 101 from top front, bottom front, top rear, and bottom rear perspectives, respectively. Several circuit cards 110 are shown in installed positions relative to the top plate 142 or the bottom plate 140. Inner side walls 126 include ribs 126' that are sized to fit within ridges 130 of the top surface 132 or 158 of the bottom plate 140. Ribs 126' prevent flames from spreading over the inner sidewall 126 through the ridge 130 or 158 and into adjacent compartments and further support the middle floor 134 and the top surface 132. Mounting tabs 138' on the bottom surface 138 and mounting tabs 142' on the top plate 142 extend vertically upward to contact the vertical sidewalls 126, 104, 105 and hold them in place. Similarly, mounting tabs 132' on the top surface 132 and mounting tabs 140' on the bottom plate extend vertically downwardly to contact the vertical sidewalls 126, 104, 105 and hold them in place.

As shown, the inner housing 101 provides eight compartments including four top chambers and four bottom chambers, with each chamber holding up to seven circuit cards 110. Thus, for the chassis 100, the inner housing 101 shown can accommodate fifty-six circuit cards 110. It is to be understood that the number of chambers spanning the width of chassis 100 may vary from the number shown, as may the number of chambers that span the height. Four are shown spanning the width and two are shown spanning the height only as an example. Furthermore, it is to be understood that the number of circuit cards per compartment may vary and that seven are shown only as an example.

To hold each circuit card, the bottom surface 138 is provided with projections 146 that hold guides on the circuit cards 110. The top plate 142 of middle floor 134 also has projections 152 to hold guides on the circuit cards 110 installed above the middle floor 134. To provide guidance for the top of the circuit cards 110 installed in the bottom chamber 125, a bottom plate 140 of the middle floor 134 has grooves or fin slots 156 running from the front edge where the cards 110 are inserted to the back edge where the backplane 106 is located. The leading edge of the top plate 142 of middle floor 134 is also grooved or slotted to align with the grooves or fin slots 156 of the bottom plate 140. The top surface 132 of the inner housing 101 also has grooves or fin slots 148 that provide guidance to the top of the circuit cards 110. The separation 143 in the middle floor 134 aids in the ability to provide grooves or fin slots 156 on the bottom side while providing projections 152 on the top side.

The ventilation slots 144 of the bottom surface 138 allow air passing up through the bottom mesh cover 116 to pass between the circuit cards 110 in the bottom chambers 125. Slots 150 of the bottom plate 140 at least partially align with the slots 144 in the bottom surface 138 and air passing up between the circuit cards 110 located in the bottom chambers 125 may pass through the slots 150 in the bottom plate 140. The top plate 142 has slots 154 that are at least partially aligned with the slots 150 of the bottom plate 140 and air passing up through the slots 150 in the bottom plate pass through the separation and then through the slots 154 in the top plate 142.

After air has passed through the middle floor 134, it may rise between circuit cards 110 installed in the top chambers. Slots 160 of the top surface 132 allow the air to pass through the top surface 132. The second mesh cover layer 121 created by the mesh strips 120 and 122 allows the air to pass into the separation between the mesh strips 120, 122 and the top mesh cover 102. Air then may pass through the top mesh cover 102.

Thus, air can be successfully channeled through the bottom cover 116 up through the chassis 100 and out through the top cover 102. When chassis are stacked, air passing out the top mesh cover 102 of the lower chassis 100 passes into the next chassis 100 through the bottom mesh cover 116. This continues until air passes out of the top mesh cover 102 of the highest stacked chassis 100. Heat generated by the circuit cards 110 is channeled up through each chassis passing through the small separation between cards 110 until it exits out of the rack.

The spacing between the top plate 142 and the bottom plate 140 of the middle floor 134 diffuses flames emanating from circuit cards 110 in the bottom chamber 125' before they may pass into the top chamber 127'. Likewise, mesh strips 120, 122 and the separation between the mesh strips 120, 122 and the mesh cover 102 diffuse flames emanating from circuit cards 110 in the top chamber 127'. Additionally, the bottom mesh cover 116 of the next chassis up in the rack assists in diffusing any flames not fully diffused by the mesh cover layers in the top of the chassis 100. Inner side panels 126 create barriers to flames escaping to the sides of the chambers so that the flame becomes trapped within a chamber between the two side panels 126, the floor, and the ceiling.

In the event of a fire, material on a given circuit card bums, soot is formed and rises. The soot may collect in the perforations of the mesh covers to clog the holes. This clogging effect assists in choking the fire. Furthermore, the bottom cover 116 catches material as it would fall from a burning card.

FIGS. 16A–16D show the backplane. As previously discussed, the backplane 106 provides several internal connectors 124 sized to engage an electrical connector on the circuit card 110. The connectors 124 generally provide signals to the circuit card 110 and/or receive signals from it. The connectors 124 pass signals between the card and the external connectors 108. The external connectors are sized to engage electrical cables passing up through a chassis rack.

As shown, fourteen external connectors 108 are provided and fifty-six internal connectors 124 are provided. Thus, each external connector communicates with four internal connectors 124. A power connector 106' is also located on the backplane and is sized to engage a power connector in the chassis rack. The power connector 106' provides power to each of the internal connectors 124 that then channel the electrical power to the circuit card 110.

FIGS. 17A–17D show several views of the repeater circuit card 110 installed relative to the bottom surface 138 of the inner housing 101 of the chassis 100. The cards 110 mount in the same fashion to the top plate 142. The repeater circuit card 110 has a guide 164 that is generally perpendicular to the card 110 and that fits between the projections 146 of the bottom surface 138 and the projections 152 of the middle floor 134. The guide 164 includes slots 166 that partially align with the slots 144 in the bottom surface. Likewise, the slots 166 partially align with the slots 154 in the top plate 142 of the middle floor 134. Thus, the air passing through the bottom surface 138 and/or through the middle floor 134 passes through the slots 166 in the guide 164 on each circuit card 110 and then between each circuit card 110 and on through the area above.

The circuit card 110 has a connector 168 that mates with card edge connector 124 on the backplane 106 of the chassis 100 once the card 110 has been fully inserted into a card position in the inner housing 101. A card faceplate 174 abuts the bottom surface 138 of the inner housing 101 and may provide a connection to the middle floor 134 or top surface 132 to lock the card 110 in place. In addition to the guide 164 aligning the card 110 in conjunction with the projections 146, 152 within a card position in the inner housing 101, fin 170 also assists by guiding the top of the card 110 when introduced into a groove or fin slot 148, 156.

FIGS. 18A–18D show various views of repeater cards 110 with a position relative to grooves or fin slots 148 in recessed areas 131 defined by ridges 132 in the top surface 130 of the inner housing 101. As the card 110 is being inserted into a card position in the inner housing 101, the fin 170 must align with the groove 148 for the card to fit perpendicularly relative to the top surface 132. A perpendicular orientation of the card relative to the top surface 132 is used in this embodiment for the guide 164 of the card 110 to seat on the middle floor 134, or bottom surface 116 and fit between the guide projections 146, 152. A perpendicular orientation also permits the card connector 168 to easily slide into and out of the backplane connector 124.

The card 110 is guided by the groove 148 as it is inserted, and once the guide 164 reaches a projection 146, 152, the guide 164 also assists in maintaining the card 110 within a designated card position. Once the card is fully inserted, the card connector 168 maintains electrical connection to the internal backplane connector 124 and the card faceplate 174 abuts the top surface 132.

FIGS. 19A–19C show various plan views and FIGS. 20A–20D show various exploded views of a T1 repeater card 110. It is to be understood that the chassis 100 may accommodate circuit cards 110 having functionality other than that of a repeater circuit. The repeater card 110 has a main printed circuit board 172 housing various electrical circuitry 172'. Typically with a repeater circuit, the card 110 will include a transceiving device to receive and reconstruct a signal having a data component and a clock component. The repeater circuitry 172' also usually includes amplification. This circuitry 172' may generate a significant amount of heat that must be dissipated by the chassis 100.

As shown, the connector 168 received by internal backplane connector 124 is an extension of the printed circuit board 172. The guide 164 with slots 166 that fits between the projections 146, 152 attaches to the bottom edge of the printed circuit board 172 and is positioned transversely relative to the circuit board 172. The guide is typically made of sheet metal. The fin 170 that fits within the groove 148, attaches to the top edge of the printed circuit board 172 and lies in a plane parallel to that of the printed circuit board 172. The fin 170 is also typically made of sheet metal.

Faceplate 174 attaches to a front edge of the repeater card 110. The faceplate typically has light emitting diodes (LEDs) 177 that allow visual inspection of the circuit card's operation. As discussed, the faceplate 174 may establish a fixed connection to the middle floor 134 or the top surface 132 with fastener 110' to hold the card 110 within the inner housing 101. A generally forward positioned finger 175 extending away from the faceplate 174 in a direction opposite to the printed circuit board 172 may be integrated into the faceplate 174 to assist in the insertion and removal of the card 110 from the chassis 100.

FIG. 21 illustrates a heat baffle 177 that may be utilized by an embodiment of the present invention. The baffle 177 has a hood portion 179. The hood portion 179 has a sloped portion 176 and triangular side panels 188. The triangular side panels 188 have mounting flanges 190 that rest on the surface of a chassis 100. The baffle 177 also has a base portion 181 having a floor 182 and a face 192. The base portion 181 lies directly over the top mesh layer 102 and the hood portion 179 directly overlays the base portion 181 with the face 192 being fixed to the sloped region 176 with clips 184 that pass through slots 186 to pinch the face 192 to a lip 189 extending from the sloped region 176. The heat baffle 177 may be utilized by inserting the baffle between chassis 100 stacked in a rack. As heat and/or flames rise from the top cover 102 of a chassis 100, the heat and/or flames are diverted out the front or back of the rack depending upon the orientation of the baffle 177.

The hood portion 179 of the baffle 177 is typically a solid sheet of rolled sheet metal. Thus, heat and flames cannot permeate the sloped surface 176 and are redirected. However, the base portion 181 is typically a mesh material such as permeated rolled sheet metal that allows heat to pass through while diffusing flames. The hood portion is fixed to the rack holding the chassis 100 with mounting flanges 178 and 180.

Figure 22:
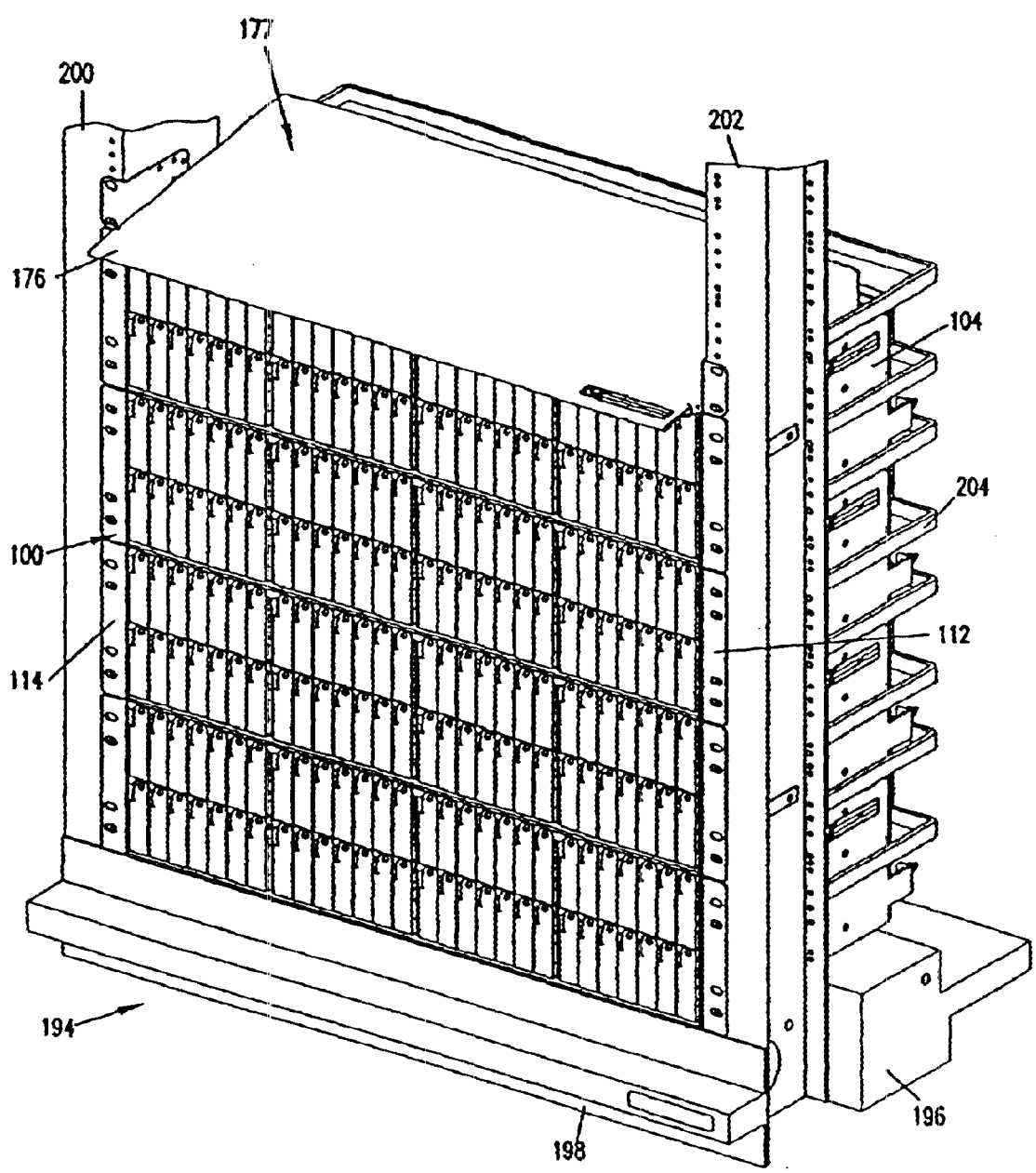
FIG. 22 is top front perspective view of a rack holding multiple chassis and the heat baffle.

FIG. 22 shows a top front perspective view of a rack 194 holding several chassis 100 with a heat baffle 177 installed. The heat rises through the chassis 100 as previously discussed and exits out the top cover 102 of the top chassis and is redirected to the rear of the rack 194 by the heat baffle 177. The typical chassis includes a base 196 with a front portion 198. Two vertical siderails 200 and 202 are included and are fixed to the base 196. Each chassis 100 and the heat baffle 177 slides into position between the siderails 200 and 202 and mounting flanges 112, 114 of the chassis 100 and the flanges 178, 180 of the baffle 177 abut the rails 200, 202. Cable bars 204 extend from the siderails 200, 202 and wrap behind each chassis 100 and baffle 177.

Figure 23A:
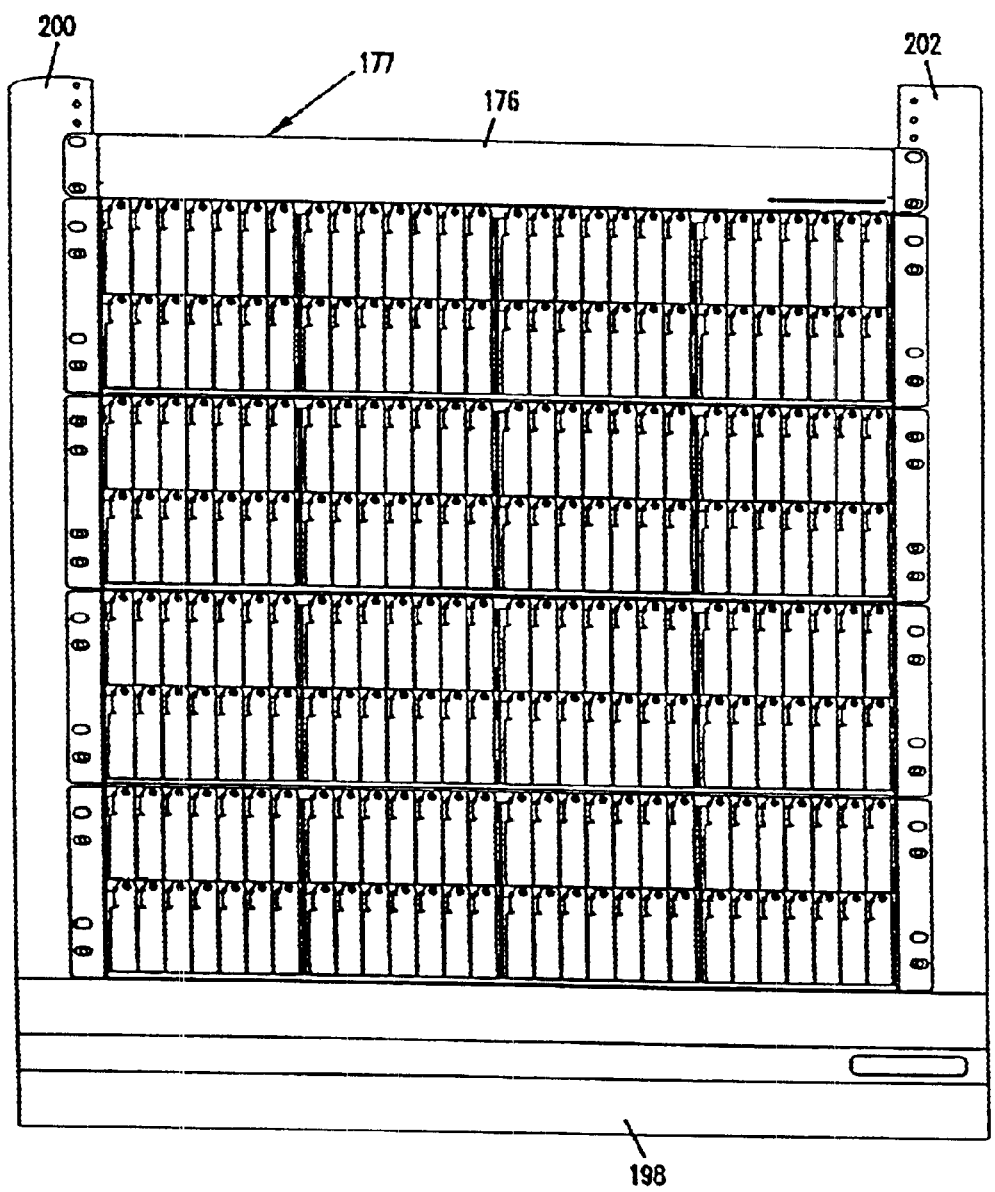
FIG. 23A is front view of a rack holding multiple chassis and the heat baffle.
Figure 23B:
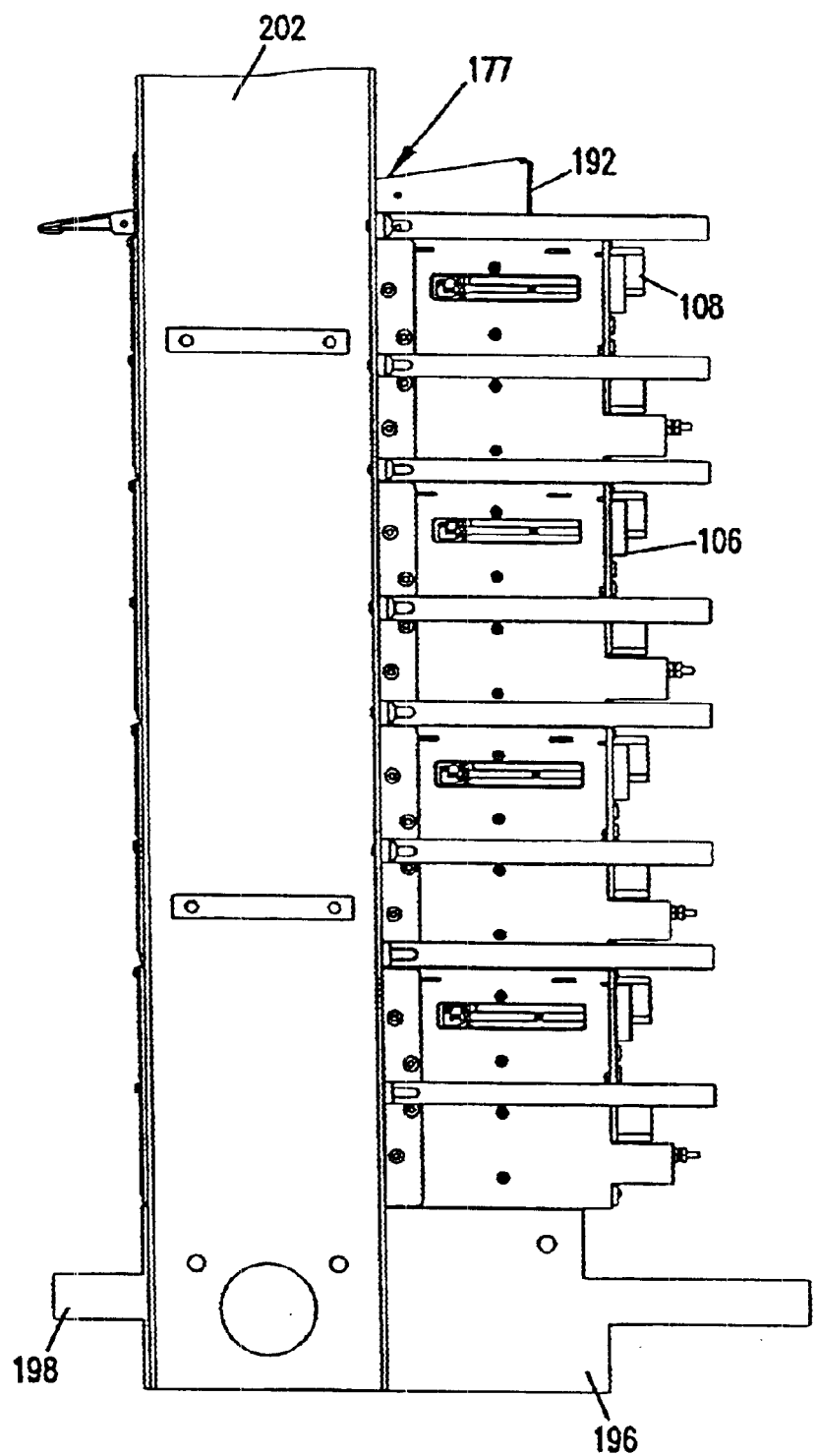
FIG. 23B is a right side view of a rack holding multiple chassis and the heat baffle.

FIGS. 23A and 23B show a front and right side view, respectively, of the rack 194 holding several chassis 100 with the heat baffle 177 installed. As shown, the heat baffle 177 is oriented with the face 192 directed to the rear of the rack 194. The face 192 is positioned over the rear portion such that it is not aligned with the backplane 106 to prevent flames escaping from the baffle 177 from curling downward into the backplane 106. The baffle 177 overhangs the front of the chassis 100 and rack 194 to allow fresh air to enter the baffle 177.

Figure 24A:
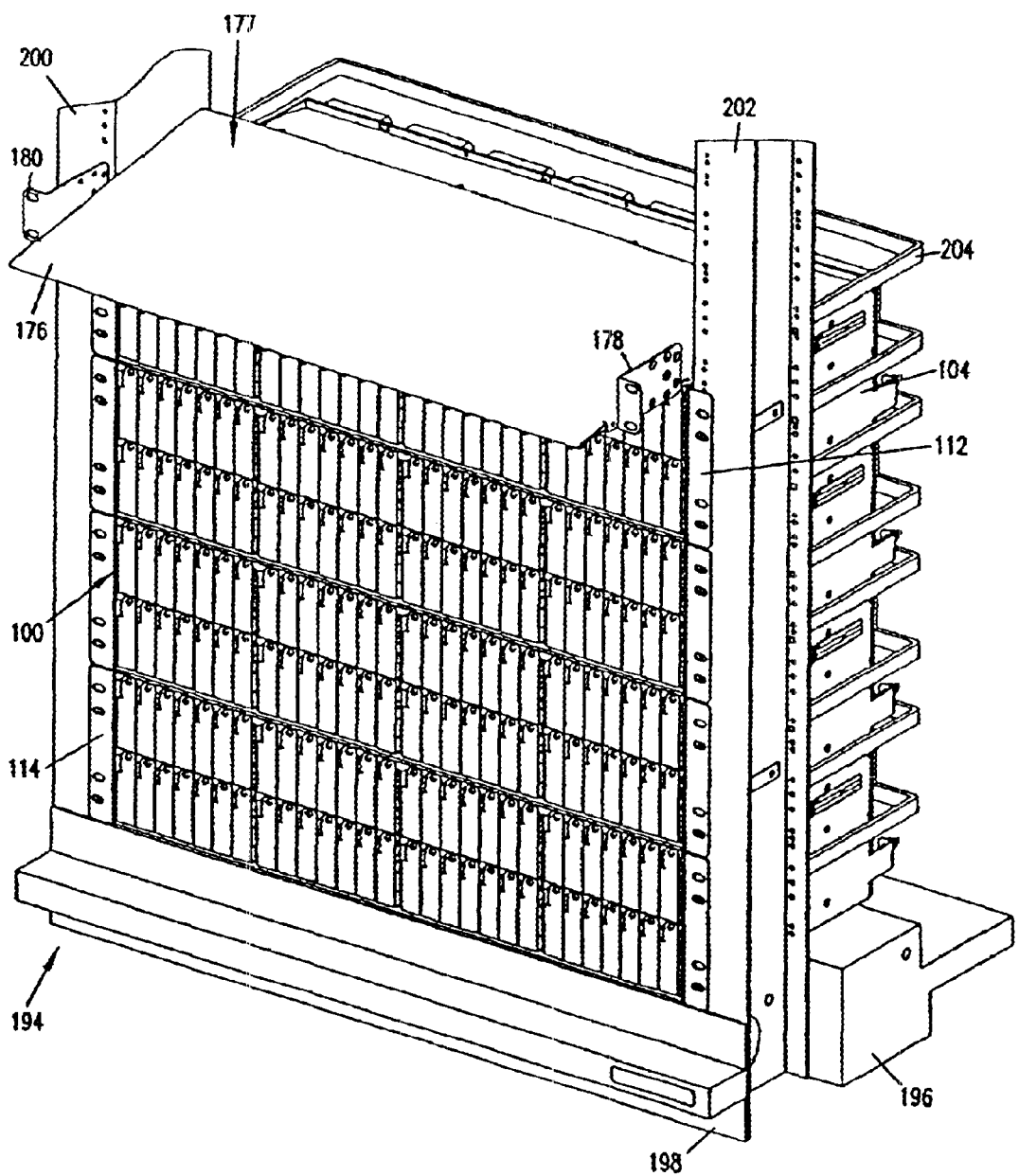
FIG. 24A is top front perspective view of a rack holding multiple chassis and the heat baffle positioned for installation.
Figure 24B:
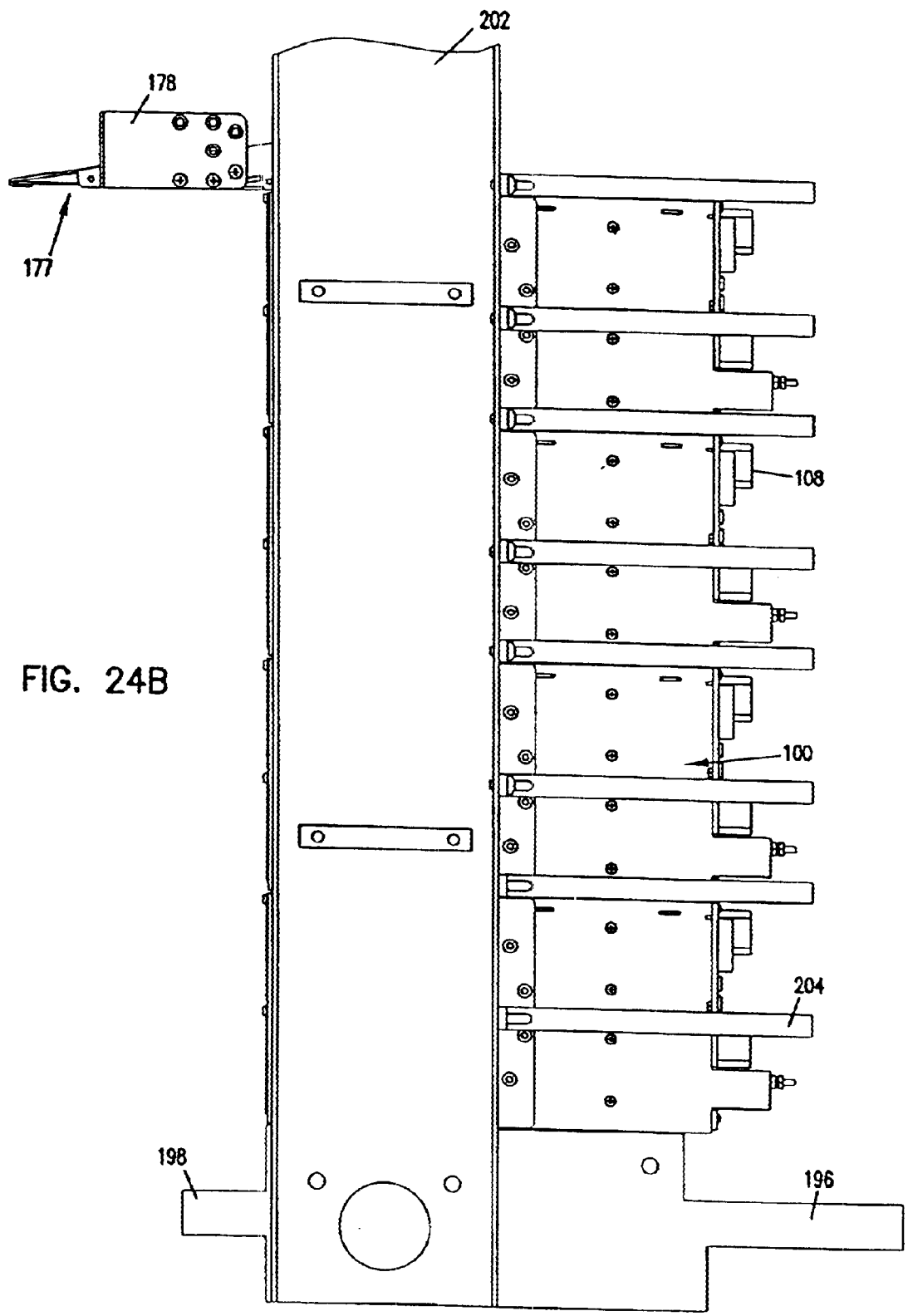
FIG. 24B is right side view of a rack holding multiple chassis and the heat baffle positioned for installation.

FIGS. 24A and 24B show a top front perspective view and a right side view, respectively, of the rack 194 with the baffle 177 positioned for installation. The baffle 177 slides into the rack 194 above the top-most chassis 100 and rests on the top cover 102 of the top-most chassis 100. The baffle 177 is inserted into the rack until the flanges 178, 180 contact the siderails 200, 202.

While the invention has been particularly shown and described with reference to preferred embodiments thereof, it will be understood by those skilled in the art that various other changes in the form and details may be made therein without departing from the spirit and scope of the invention.

What is claimed is:

1. A chassis for housing telecommunications cards, comprising:
    an inner housing with vertical sidewalls, a top surface, and a bottom surface, wherein the top surface and the bottom surface have a plurality of openings;
    a middle floor disposed within the inner housing dividing the inner housing into a top chamber and a bottom chamber, the middle floor including a bottom plate and a top plate, wherein the top plate overlays the bottom plate with a separation between at least portions of the top plate and the bottom plate, wherein the bottom plate has openings that at least partially align with openings provided in the top plate, and wherein a front edge of the top surface, top plate, and vertical sidewalls defines a top chamber opening and a front edge of the bottom plate, bottom surface, and vertical sidewalls defines a bottom chamber opening;
    a first cover overlaying the top surface; and
    a bottom cover underlaying the bottom surface.

2. The chassis of claim 1, further comprising a second cover disposed between the top surface and the first cover with a separation between the second cover and the first cover, wherein the first and second cover are mesh and the openings are slot shaped.

3. The chassis of claim 1, wherein the top plate and the top surface define first and second horizontal surfaces of the top chamber and one of the horizontal surfaces of the top chamber has grooves and the other horizontal surface of the top chamber has projections for receiving longitudinal guides and fins of the telecommunications card, and wherein the bottom plate and the bottom surface define first and second horizontal surfaces of the bottom chamber and one of the horizontal surfaces of the bottom chamber has grooves and the other horizontal surface of the bottom chamber has projections for receiving longitudinal guides and fins of the telecommunications card.

4. The chassis of claim 1, further comprising a plurality of vertical sidewalls dividing the top and bottom chambers into a plurality of compartments.

5. The chassis of claim 4, wherein the vertical sidewalls are solid.

6. A chassis for housing telecommunications cards, comprising:
    an inner housing with vertical sidewalls, a top surface, and a bottom surface, wherein the top surface and the bottom surface have a plurality of openings; and
    wherein a front edge of the top surface, bottom surface, and each vertical sidewall defines an inner housing opening; and
    a first mesh cover overlaying at least a portion of the top surface of the inner housing; and
    a second mesh cover overlaying the first mesh cover and the top surface with a separation existing between the second mesh cover and the first mesh cover; and
    a middle floor disposed within the inner housing dividing the inner housing into a top chamber and a bottom chamber, wherein the middle floor includes a bottom plate and a top plate, wherein the top plate overlays the bottom plate with a separation between at least portions of the top plate and the bottom plate, and wherein the bottom plate has slots that partially align with slots provided in the top plate.

7. The chassis of claim 6, further comprising:
    projections on the bottom surface and the top plate for receiving longitudinal guides of telecommunications cards; and
    grooves in the top surface and the bottom plate for receiving longitudinal fins of telecommunications cards.

8. A chassis for housing telecommunications cards, comprising:
    an inner housing with vertical sidewalls, a top surface, a bottom surface, and a plurality of spaced inner side walls forming a plurality of compartments within the inner housing, wherein the top surface and the bottom surface have a plurality of spaced slots;
    a middle floor disposed within the inner housing dividing each of the plurality of compartments into a top chamber and a bottom chamber, the middle floor including a bottom plate and a top plate, wherein the top plate overlays the bottom plate with a separation between at least portions of the top plate and the bottom plate, and wherein the bottom plate has slots that partially align with slots provided in the top plate and the slots of the top surface and the bottom surface at least partially align with the slots in the top plate and the bottom plate;
    a first mesh cover overlaying at least a portion of the top surface of the inner housing;
    a second mesh cover overlaying the first mesh cover and the top surface with a separation existing between the second mesh cover and the first mesh cover; and
    a bottom mesh cover underlaying the bottom surface of the inner housing.

9. The chassis of claim 8, wherein the top plate and the top surface define first and second horizontal surfaces of the top chamber and one of the horizontal surfaces of the top chamber has grooves and the other horizontal surface of the top chamber has projections for receiving longitudinal guides and fins of the telecommunications card, and wherein the bottom plate and the bottom surface define first and second horizontal surfaces of the bottom chamber and one of the horizontal surfaces of the bottom chamber has grooves and the other horizontal surface of the bottom chamber has projections for receiving longitudinal guides and fins of the telecommunications card.

10. The chassis of claim 8, further comprising a baffle overlaying the second mesh cover, the baffle including a sloped region overlying a mesh base.

11. The chassis of claim 8, wherein the first mesh cover comprises first and second mesh strips, the first and second mesh strips having cover projections that extend to the second mesh cover to establish separation between the first and second mesh covers.

12. A chassis for housing telecommunications cards, comprising:

an inner housing with vertical sidewalls, a first horizontal surface, and a second horizontal surface, wherein the first horizontal surface and the second horizontal surface have a plurality of openings;

a third horizontal surface disposed within the inner housing between the first and second horizontal surfaces that divides the inner housing into a top chamber and a bottom chamber, the third horizontal surface including a first horizontal plate and a second horizontal plate, wherein the first horizontal plate overlays the second horizontal plate with a separation between at least portions of the first horizontal plate and the second horizontal plate, and wherein the first horizontal surface and first horizontal plate define first and second horizontal surfaces of the top chamber and one of the horizontal surfaces of the top chamber has grooves and the other horizontal surface of the top chamber has projections for receiving a fin and guide of a telecommunications card, and wherein the second horizontal surface and second horizontal plate define first and second horizontal surfaces of the bottom chamber and one of the horizontal surfaces of the bottom chamber has grooves and the other horizontal surface of the bottom chamber has projections for receiving a fin and guide of a telecommunications card;

a first cover overlaying at least a portion of an outer portion of the first horizontal surface of the inner housing; and a bottom cover underlaying at least a portion of an outer portion of the second horizontal surface.

13. The chassis of claim 12, wherein the first horizontal surface, the second horizontal surface, the first horizontal plate, and the second horizontal plate contain slots and the slots in the first horizontal plate and the second horizontal plate are at least partially aligned.

14. The chassis of claim 13, wherein the first horizontal surface and the second horizontal plate have grooves, the second horizontal surface and the first horizontal plate have projections, the first horizontal surface faces the first horizontal plate, the second horizontal surface faces the second horizontal plate.

15. The chassis of claim 14, wherein the grooves of the first horizontal surface and the second horizontal plate are positioned adjacently along a first axis, the slots of the first horizontal surface and the second horizontal plate are positioned adjacently along the first direction such that a groove lies between two slots with respect to the first axis.

16. The chassis of claim 14, wherein the projections of the second horizontal surface and the first horizontal plate are positioned adjacently along a first axis, the slots of the second horizontal surface and the first horizontal plate are positioned adjacently along the first axis such that a projection lies between two slots with respect to the first axis.

17. The chassis of claim 13, further comprising a vertical backplane disposed perpendicularly to the vertical sidewalls along a rear edge of the inner housing, the vertical backplane having connectors for receiving an electrical connector of a telecommunication card.

18. The chassis of claim 12, wherein the first cover and the bottom cover are mesh.

19. The chassis of claim 18, wherein a separation exists between the first cover and the first horizontal surface.

* * * * *